US012131977B2

(12) United States Patent
Faneuf et al.

(10) Patent No.: US 12,131,977 B2
(45) Date of Patent: Oct. 29, 2024

(54) ELECTRONIC SYSTEMS WITH INVERTED CIRCUIT BOARD WITH HEAT SINK TO CHASSIS ATTACHMENT

(71) Applicant: Intel Corporation, Santa Clara, CA (US)

(72) Inventors: Barrett M. Faneuf, Beaverton, OR (US); Phil Geng, Washougal, WA (US); Kenan Arik, Hillsboro, OR (US); David Shia, Portland, OR (US); Casey Winkel, Hillsboro, OR (US); Sandeep Ahuja, Portland, OR (US); Eric D. McAfee, Portland, OR (US); Jeffory L Smalley, East Olympia, WA (US); Minh T. D. Le, North Plains, OR (US); Ralph V. Miele, Hillsboro, OR (US); Marc Milobinski, Scappoose, OR (US); Aaron P. Anderson, Beaverton, OR (US); Brendan T. Pavelek, Portland, OR (US); Carlos Alvizo Flores, Guadalajara (MX); Fernando Gonzalez Lenero, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/498,891

(22) Filed: Oct. 31, 2023

(65) Prior Publication Data

US 2024/0063082 A1    Feb. 22, 2024

Related U.S. Application Data

(63) Continuation of application No. 16/986,122, filed on Aug. 5, 2020, now Pat. No. 11,842,943.

(Continued)

(51) Int. Cl.
*H01L 23/367* (2006.01)
*G11C 5/06* (2006.01)
(Continued)

(52) U.S. Cl.
CPC ............ *H01L 23/3677* (2013.01); *G11C 5/06* (2013.01); *H05K 7/1422* (2013.01); *H05K 7/20509* (2013.01)

(58) Field of Classification Search
CPC .. H05K 7/1422; H05K 7/2039; H05K 7/2049; H05K 7/20409–20418;
(Continued)

(56) References Cited

U.S. PATENT DOCUMENTS 4,665,467 A * 5/1987 Speraw ................. H05K 7/209
174/16.3
9,500,417 B2   11/2016 Sheng-Huang
(Continued)

FOREIGN PATENT DOCUMENTS

GB    2576032 B    4/2021
GB    2576030 B    12/2021
(Continued)

OTHER PUBLICATIONS

Geng, Phil, "Structural Design of Land Grid Array Loading Mechanisms for Intel Central Processor Unit Stack Retention," Journal of Electronic Packaging, Mar. 2019, 8 pages.
(Continued)

*Primary Examiner* — Amir A Jalali
(74) *Attorney, Agent, or Firm* — Hanley, Flight & Zimmerman, LLC

(57) ABSTRACT

An apparatus is described. The apparatus includes a housing including a base and sidewalls. The housing is to support a circuit board. The apparatus also includes a heat sink to be supported by the housing independent of the circuit board.
(Continued)

The heat sink is to be thermally coupled to a semiconductor package attached to the circuit board. The heat sink is to be closer to the base of the housing than the circuit board is to be to the base of the housing.

20 Claims, 26 Drawing Sheets

Related U.S. Application Data

(60) Provisional application No. 62/883,532, filed on Aug. 6, 2019.

(51) Int. Cl.
*H05K 7/14* (2006.01)
*H05K 7/20* (2006.01)

(58) Field of Classification Search
CPC ........... H05K 7/20154; H05K 7/20509; H05K 7/209; H05K 1/0201–0203; H01L 23/3677; H01L 23/40–4006; H01L 23/4081; H01L 23/4087; H01L 23/4093; H01L 2023/4062; H01L 2023/4037; H01L 2023/405; H01L 2023/4075–4087; G06F 1/20; G06F 1/203; G01R 1/0458; G11C 5/06
See application file for complete search history.

(56) References Cited

U.S. PATENT DOCUMENTS

| | | | |
|---|---|---|---|
| 10,440,812 B2* | 10/2019 | He | ........................ H01L 23/433 |
| 2005/0068740 A1 | 3/2005 | Ulen | |
| 2005/0117305 A1* | 6/2005 | Ulen | ................... H01L 23/4006 |
| | | | 257/E23.084 |
| 2006/0171117 A1 | 8/2006 | Hamman | |
| 2006/0215383 A1 | 9/2006 | Unrein | |
| 2006/0285297 A1 | 12/2006 | Conner | |
| 2008/0084664 A1* | 4/2008 | Campbell | ................. G06F 1/20 |
| | | | 361/699 |
| 2011/0313576 A1 | 12/2011 | Nicewonger | |
| 2012/0113603 A1 | 5/2012 | Tokunaga | |
| 2012/0262878 A1 | 10/2012 | Ikeda | |
| 2013/0083488 A1* | 4/2013 | Watanabe | ........... H01L 23/4006 |
| | | | 257/E23.083 |
| 2014/0071647 A1 | 3/2014 | Bridges | |
| 2015/0327353 A1 | 11/2015 | Dickover | |
| 2017/0064868 A1 | 3/2017 | Rush | |
| 2019/0196558 A1* | 6/2019 | Grossman | ............... G06F 1/183 |
| 2019/0239386 A1 | 8/2019 | Chen | |
| 2020/0117250 A1 | 4/2020 | Lengefeld | |
| 2020/0260613 A1 | 8/2020 | Winkel | |
| 2021/0320050 A1 | 10/2021 | Robinson et al. | |
| 2023/0254995 A1 | 8/2023 | Robinson et al. | |

FOREIGN PATENT DOCUMENTS

| | | |
|---|---|---|
| GB | 2597525 A | 2/2022 |
| GB | 2601357 A | 6/2022 |

OTHER PUBLICATIONS

United States Patent and Trademark Office, "Non-Final Office Action," issued in connection with U.S. Appl. No. 16/986,122, mailed on Feb. 3, 2023, 17 pages.

United States Patent and Trademark Office, "Notice of Allowance and Fee(s) Due," issued in connection with U.S. Appl. No. 16/986,122, mailed on Jul. 18, 2023, 8 pages.

* cited by examiner

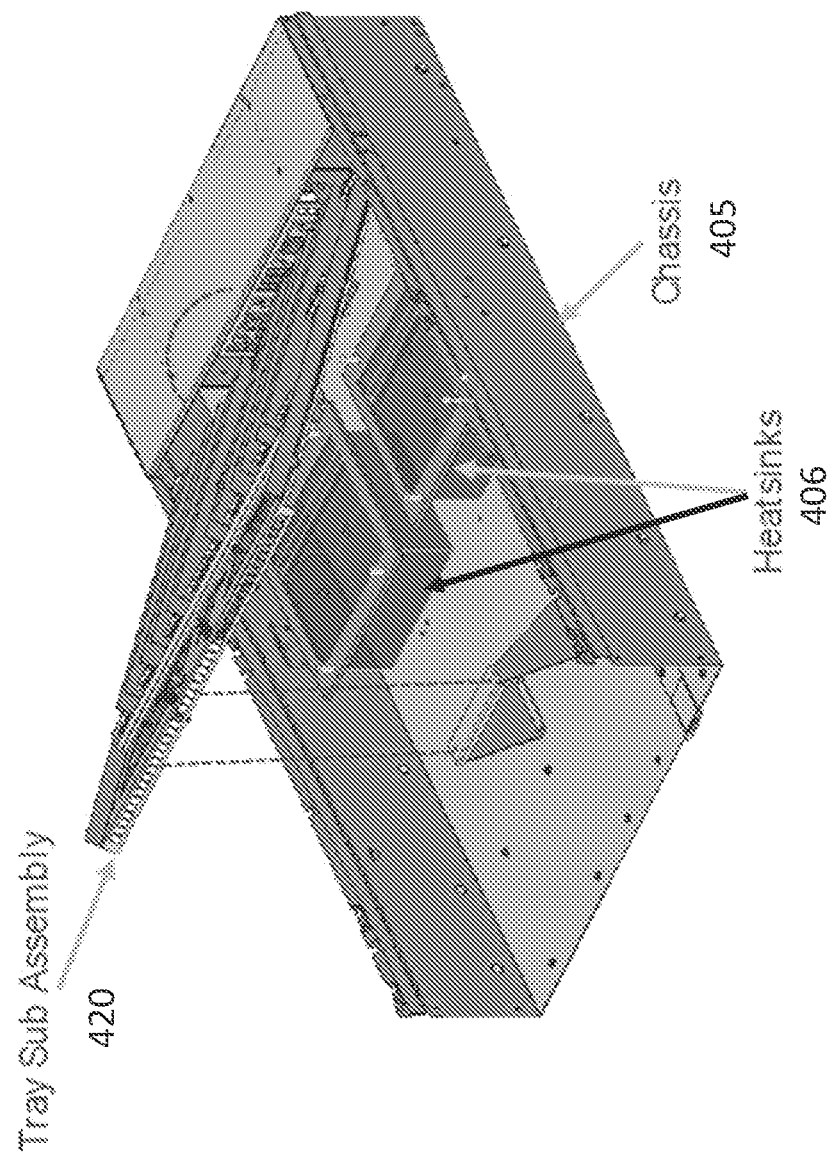

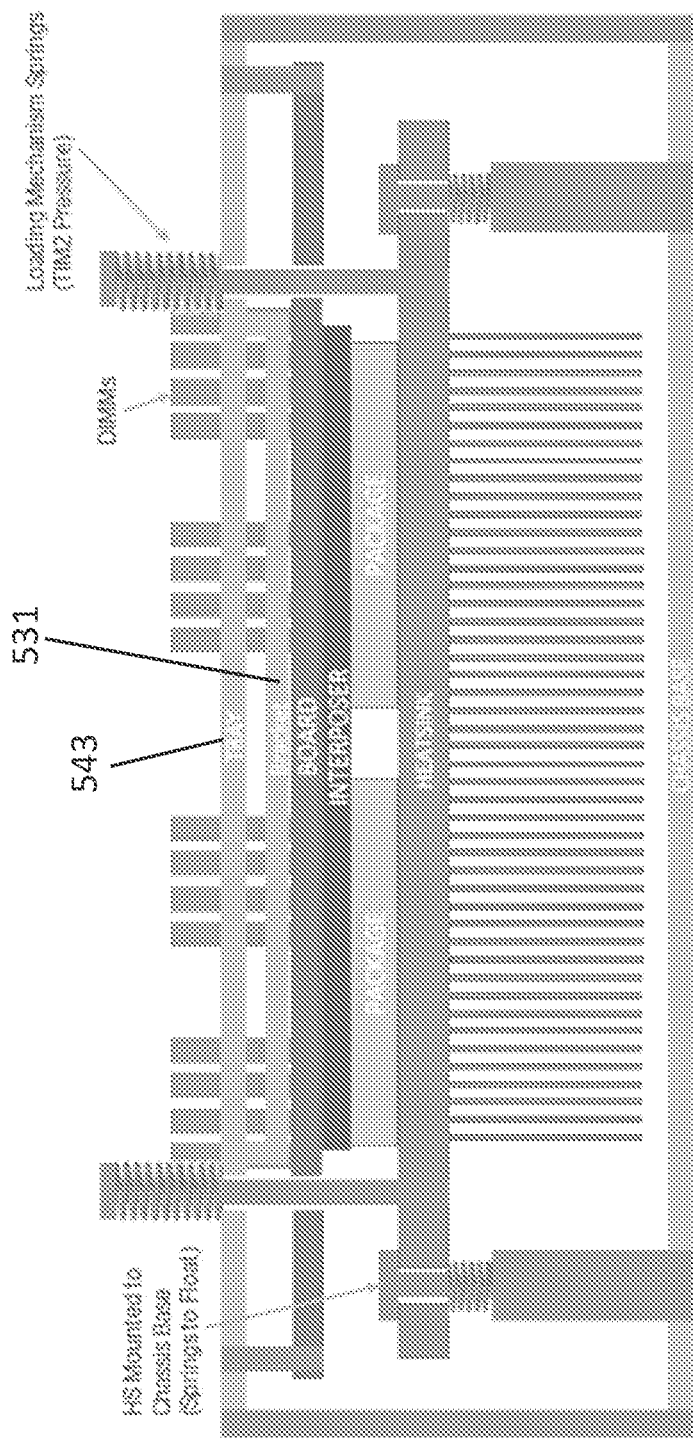

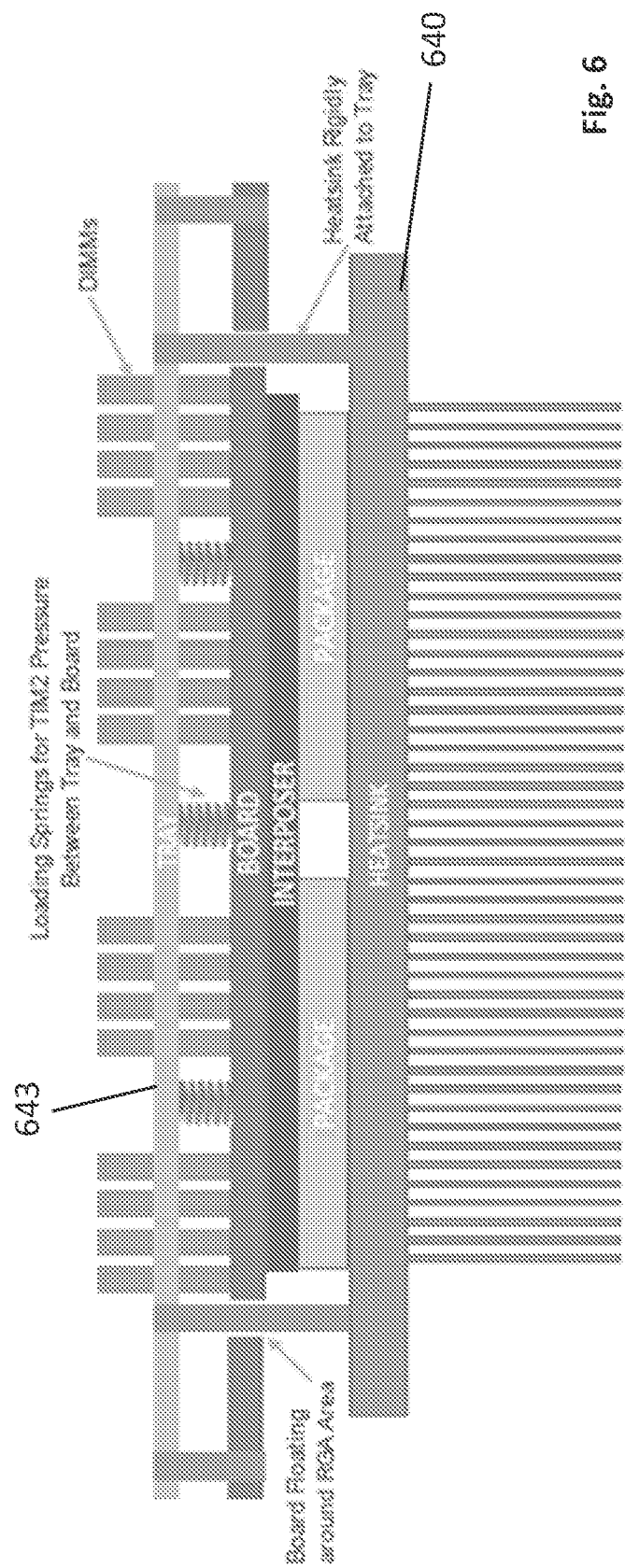

ELECTRONIC SYSTEMS WITH INVERTED CIRCUIT BOARD WITH HEAT SINK TO CHASSIS ATTACHMENT

RELATED CASES

This patent arises from a continuation of U.S. patent application Ser. No. 16/986,122, entitled, "ELECTRONIC SYSTEMS WITH INVERTED CIRCUIT BOARD WITH HEAT SINK TO CHASSIS ATTACHMENT", filed Aug. 5, 2020, which claims the benefit of U.S. Provisional Patent Application No. 62/883,532, entitled, "INVERTED SYSTEM ARCHITECTURE FOR CPU BOARDS AND STRUCTURAL AND LEAK CAPTURE TRAY", filed Aug. 6, 2019. Priority to U.S. patent application Ser. No. 16/986,122 and U.S. Provisional Patent Application No. 62/883,532 is claimed. U.S. patent application Ser. No. 16/986,122 and U.S. Provisional Patent Application No. 62/883,532 are incorporated herein by reference in their entireties.

FIELD OF INVENTION

The field of invention pertains generally to electronic systems, and, more specifically, to electronic systems with inverted circuit board with heat sink to chassis attachment.

BACKGROUND

System packaging engineers face challenges as both computing systems designers and networking systems designers continue to pack as much performance and functionality as is practicable into a single (e.g., rack mountable) system chassis. Creative packaging designs are therefore needed to keep pace and satisfy the requirements of such aggressive system designs.

BRIEF DESCRIPTION OF THE DRAWINGS

A better understanding of the present invention can be obtained from the following detailed description in conjunction with the following drawings, in which:

FIG. 4 shows attachment of a tray sub assembly with inverted double sided printed circuit board to a chassis with attached heat sinks attached to the chassis;

FIG. 5b shows a second embodiment of a system with heat sinks that are attached to the chassis;

FIG. 6 shows a fifth embodiment of a system with heat sinks that are attached to the chassis;

DETAILED DESCRIPTION

1.0 Inverted Double Sided Circuit Board

Figure 1:
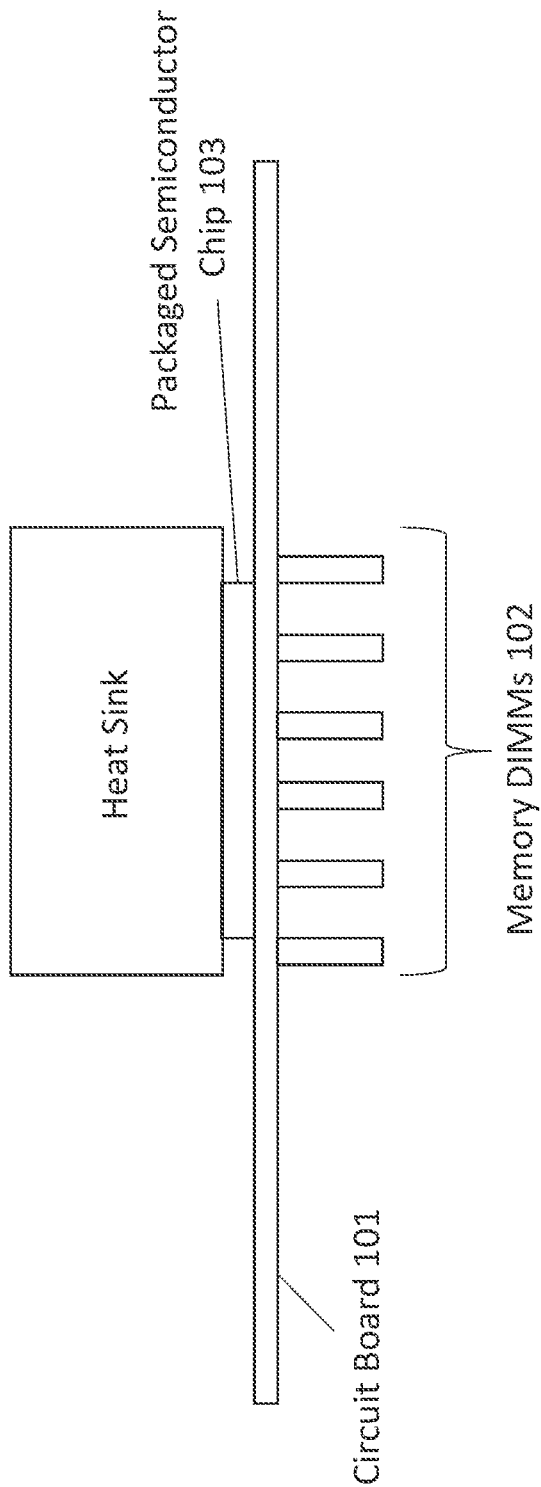
FIG. 1 shows a traditional double sided printed circuit board.

FIG. 1 shows a simplistic depiction of a double sided electronic circuit board 101 (e.g., "motherboard"). Electronic circuit boards have traditionally been single sided in the sense that the larger semiconductor chips and/or modules (e.g., memory modules) that are connected to the electronic circuit board 101 are connected to only one side of the board 101. Recently, double sided electronic circuit boards have been implemented where some of the larger chips and/or modules are connected to both (opposite) sides of the board 101.

In the particular embodiment of FIG. 1, the electronic circuit board 101 includes a high performance packaged semiconductor chip 103 (e.g., central processing unit (CPU) processor chips, graphics processing unit (GPU) chips, etc.) attached to one side of the board 101 and memory modules 102 (such as dual in-line memory modules (DIMMs)) plugged into sockets on the opposite side of the board 101. Here, the system designers desire to let the end-user plug memory modules with ease into the memory module side of the board 101. That is, the end users are allowed to configure the memory of the system according to their own price/performance choices and are free to plug a specific number (up to some maximum) and kind(s) of memory modules into the system as they choose.

Figure 2:
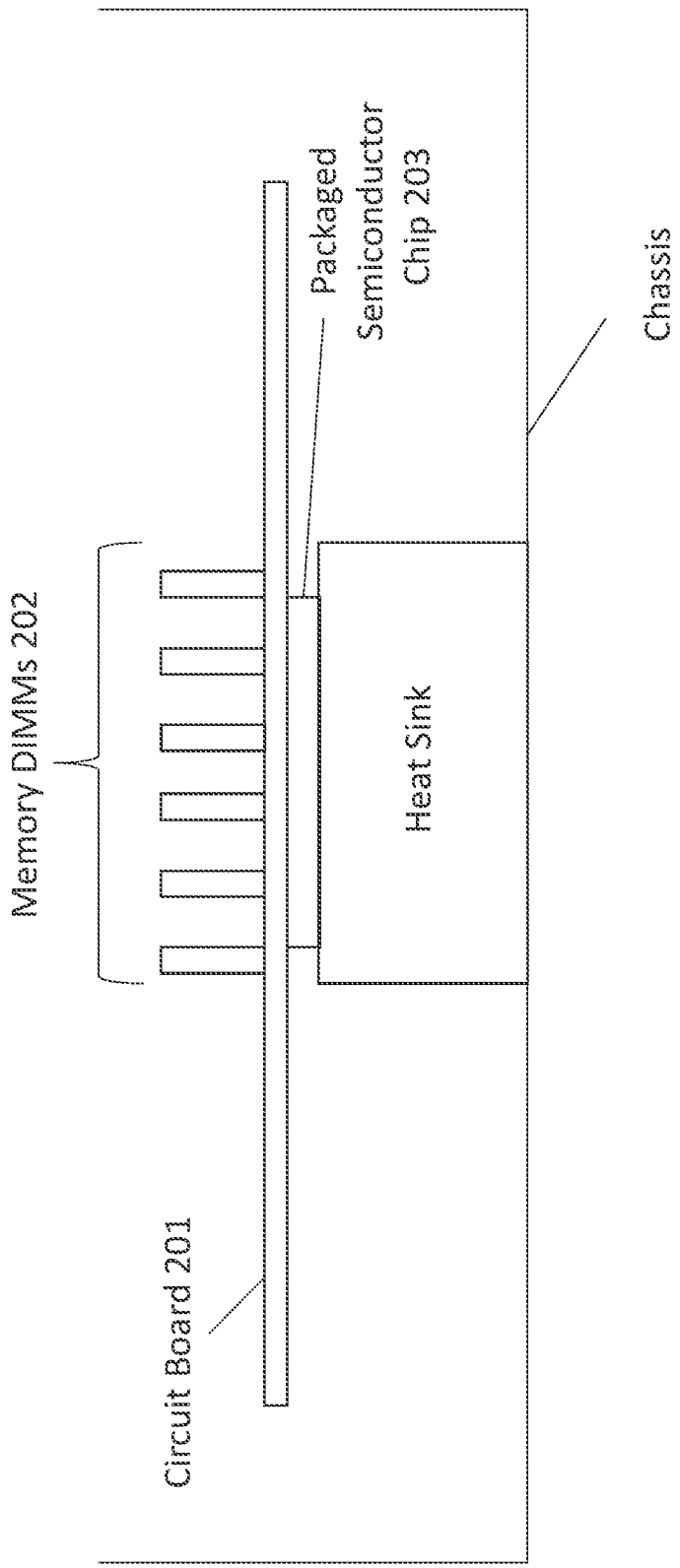
FIG. 2 shows an inverted double sided printed circuit board.

However, as observed in FIG. 2, allowing the end user to determine and implement the memory configuration of the system results in the memory module side of the electronic board being the "top side" that is exposed to the end user and the packaged semiconductor chip side of the electronic board being the "bottom side" that is hidden from view and/or easy user access.

Figure 3:
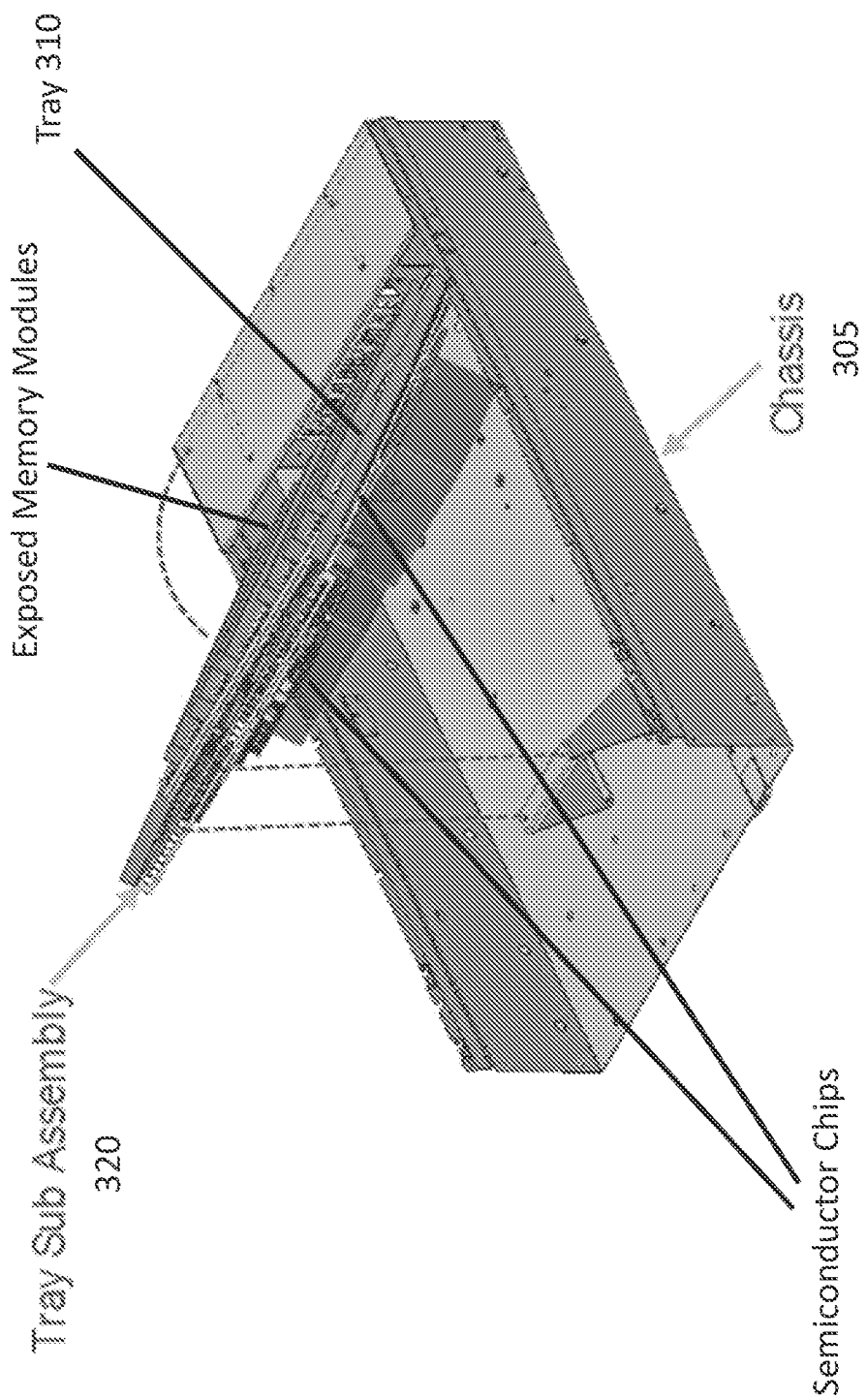
FIG. 3 shows attachment of a tray sub assembly with inverted double sided printed circuit board and attached heat sinks to a chassis.

As observed in FIG. 3, the electronic board is first fasted to a tray 310 which acts as a support for the board. A mounting frame may exist between the board and tray to further support the board. There are also openings in the tray to expose the memory modules.

Once the electronic board is fastened to the tray 310, the assembled board and tray, referred to as a tray sub assembly 320, are mounted to the chassis 305. Here, akin to a cabinet or chest that supports a drawer, the chassis 305 has rails or other kinds of guides that mechanically interface with the tray 310. In order to mount the tray sub assembly to the chassis 305, the tray 310 slides on the rails/guides until it reaches the correct positioning, at which point, the tray sub assembly 320 is hard fastened to the chassis 305 (e.g., with bolts, screws, etc.). The chassis 305 with mounted tray sub assembly 320 can then be mounted to a rack or other larger mechanical housing/frame.

Notably, the packaged semiconductor chips, being mounted to the bottom side of the electronic board "hang upside down" or are "inverted" when the assemblage processes are complete.

A problem is that with the aggressive packaging and functional performance of the overall system, the electronic board and/or the electrical connections between the bottom of the electronic board and semiconductor chips are more prone to damage with the inverted mounting of the semiconductor chips.

Here, the use of higher performance semiconductor chips not only necessitates higher density, finer pitch wires and/or I/Os within the electronic board and/or between the electronic board and the semiconductor chips, but also, necessitates the use of larger mass heat sinks (higher performance semiconductor chips generate more heat). The use of larger mass heat sinks combined with their inverted integration, without additional mechanical design precautions, exposes the electronic board to significant risk of damage. Specifically, with the heavy heat sinks "hanging" upside down from the lids of the semiconductor packages they are respectively attached to, any jostle or movement of the heat sinks during, e.g., the attachment of the board to the tray to form the tray sub assembly 320, the mounting of the tray sub assembly 320 to the chassis 305 and/or the completed chassis 305 to a rack could torque/bend the electronic board to the point of damage.

FIG. 4 therefore shows an improved approach in which the heat sinks 406 are initially mounted to the chassis 405 so that the heat sinks 406 are not attached to the semiconductor chips when the board is mounted to the tray to form the tray sub assembly 420. After the tray sub assembly 420 is formed (again, without the heat sinks 406 being attached to the semiconductor chips), the tray sub assembly 420 is attached to the chassis 405 and heat sinks 406. Here, for example, with the tray sub assembly 420 being angled as depicted, leading edge corners of the tray slide on chassis rails until they engage at the base of the chassis 405, at which point, the tray sub assembly 420 rotates downward onto the heat sinks 406 which are aligned to mechanically couple to the lids of the semiconductor chips that are on the bottom side of the electronic board and are also exposed through the underside of the tray.

Figure 5A:
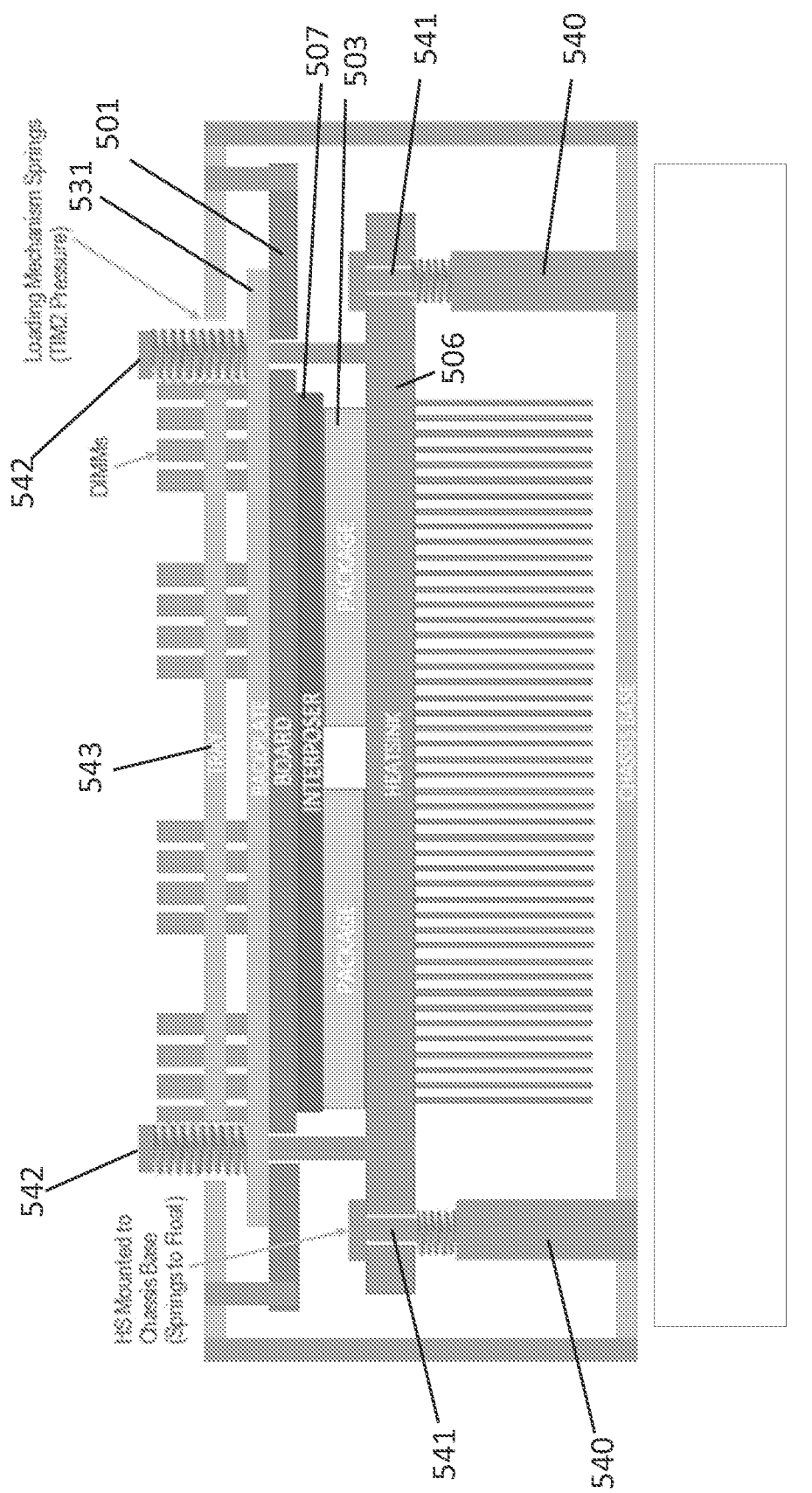
FIG. 5a shows a first embodiment of a cross section of a system with heat sinks that are attached to the chassis.

FIGS. 5a and 5b shows respective cross sections of different embodiment for a first more general mechanical approach (referred to as Chassis Attached Suspended Heat Sink (CASH). According to the first CASH approach of FIG. 5a, the heat sink is initially mounted onto standoffs 540 and then hard fastened to the chassis with spring loaded bolts/screws 541 that thread into threaded openings in the standoffs (the particular design of FIG. 5a attaches one heat sink to two semiconductor chips).

Then, after the tray sub assembly is engaged with the chassis and positioned onto the heat sink, a backplate 531, the electronic circuit board 501, an interposer 507, the packaged semiconductor chips 503 and heat sink 506 are secured together through spring loaded bolts/screws 542 that run through holes in the backplate 531 and board 502 and anchor into threaded holes of the heat sink 506. Once the bolts/screws 542 are anchored into the heat sink 506, the overall mechanical structure prevents torqueing of the heat sink 506 relative to the board 501. Essentially, the structure that is sandwiched by bolts/screws 542 prevent torqueing of the board and torqueing of the heat sink 506 relative to the board 501, while, bolts/screws 541 prevent torqueing of the heat sink 506 generally.

Here, the springs associated with both mounts 541, 542 permit some vertical movement of the backplate, board, chip and heat sink relative to one another (e.g., to accommodate component thickness tolerance and flexibility into the formation and final positioning of the tray sub assembly and/or chassis mounting). However, generally, mounts 541, 542 prevent rotation and/or lateral movement of the heat sink 506 relative to the board 501 thereby eliminating exposure to board damage.

FIG. 5b shows another CAST approach but the backplate 531 is formed as an extended feature of the tray 543. As such, there is no mechanical difference between the backplate 531 and tray 543, and, as depicted in FIG. 5b, the board 501, chips 503 and heat sink 506 are mounted directly to the tray 543. Freedom of vertical movement therefore exists between the tray, board, chip and heat sink.

Figure 5C:
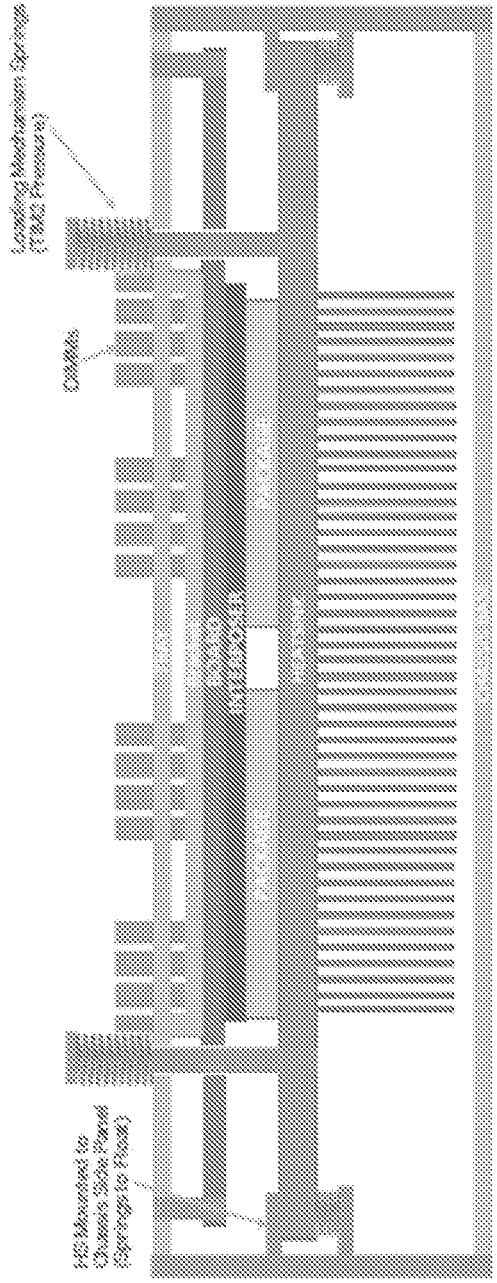
FIG. 5c shows a third embodiment of a system with heat sinks that are attached to the chassis.
Figure 5D:
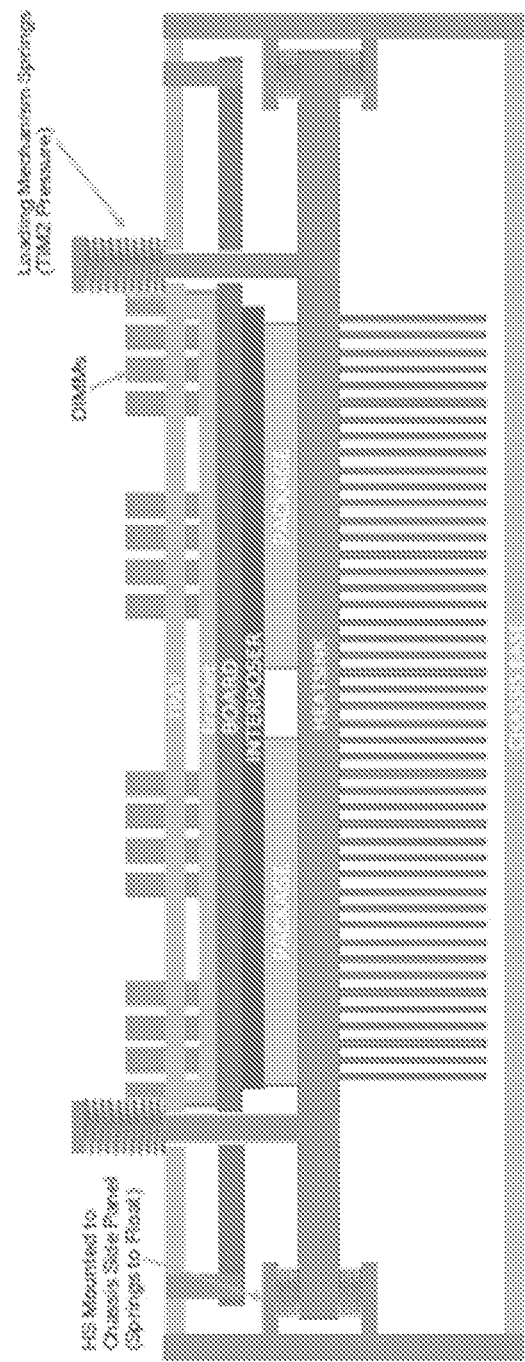
FIG. 5d shows a fourth embodiment of a system with heat sinks that are attached to the chassis.

FIGS. 5c and 5d show additional similar embodiments where the heat sink's anchor to the chassis is at the sidewalls of the chassis rather than the chassis floor. As with the embodiments of FIGS. 5a and 5b, the mounts remain vertical and spring loaded. Therefore, as with the embodiments of FIGS. 5a and 5b, vertical movement of the heat sink is allowed but lateral and/or rotation movement is substantially prevented. The embodiment of FIG. 5d, having two springs per heat sink/chassis mount allows greater vertical freedom of movement (the embodiment of FIG. 5c has a hard stop of vertical movement at one end of the bolt/screw whereas the embodiment of FIG. 5d has no such hard stop of vertical movement).

Note that combined embodiments can exist that include both mount(s) to the chassis floor and mounts to the chassis sidewalls.

Referring back to FIGS. 5a and 5b, note that, depending on the relative mass of the heat sink 506 and backplate 531, for example, the heat sinks could be mounted to the backplate during tray sub assembly formation and prior to the mounting of the heat sinks to the chassis. In the case, the overall integration of the tray sub assembly to the chassis would appear more like FIG. 3 than FIG. 4.

FIG. 6 shows another approach, referred to as chassis attached suspended tray (CAST), that also integrates the heat sink with the tray sub assembly prior to the heat sink's attachment to the chassis (as such, again, the overall integration of the tray sub assembly to the chassis would appear more like FIG. 3 than FIG. 4.).

In the CAST approach of FIG. 6 the heat sink is rigidly mounted to the tray 643. Here, the rigid mounting of the heat sink 640 to the tray 643 substantially prevents any movement (including vertical movement) of the heat sink 640 relative to the tray 643. As such, vertical movement is permitted of the board and chip relative to the tray and relative to the heat sink. Here, springs are located between the board and tray for board attachment to the tray. The springs (which correspond to the chip package area) are also used to apply a compressive load between the heat sink base and chip package top surface, which ensures high thermal coupling efficient between the two.

Figure 7:
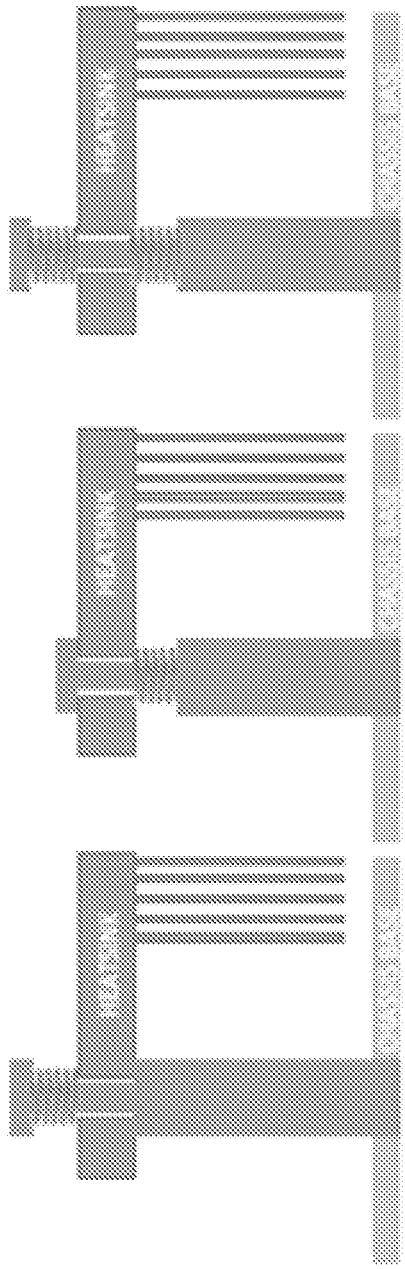
FIG. 7 shows different approaches for anchoring a heat sink to a chassis.

Note that in each of the embodiments of FIGS. 5a-d and FIG. 6, there is rigid direct attachment of the mount to the heat sink. FIG. 7 shows that, for any of these approaches, more vertical freedom of movement can be introduced into the system by incorporating one or two springs to the direct heat sink attachment.

Figure 8:
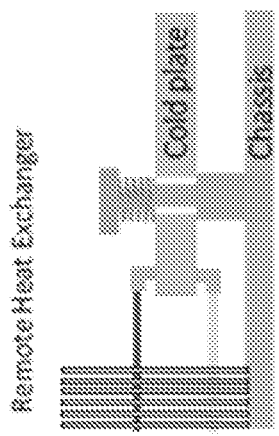
FIG. 8 shows attachment to a chassis of a cold plate of a liquid cooling system.

FIG. 8 shows that, for any of the above embodiments, the heat sink may include or be replaced by a cold plate, manifold or other fixture that is a component of liquid cooling system. Here, cooled fluid flows through the plate and warmed fluid (that is warmed from the chip's heat dissipation) is removed from the plate.

2.0 General Inverted Circuit Board Structures

Apart from special board designs, such as the double sided board having memory and logic chips disposed on opposite sides of the board as described just above, inverted package structures more generally lend themselves to solving problematic trends that are emerging with traditional chassis, tray and board designs.

Figure 9:
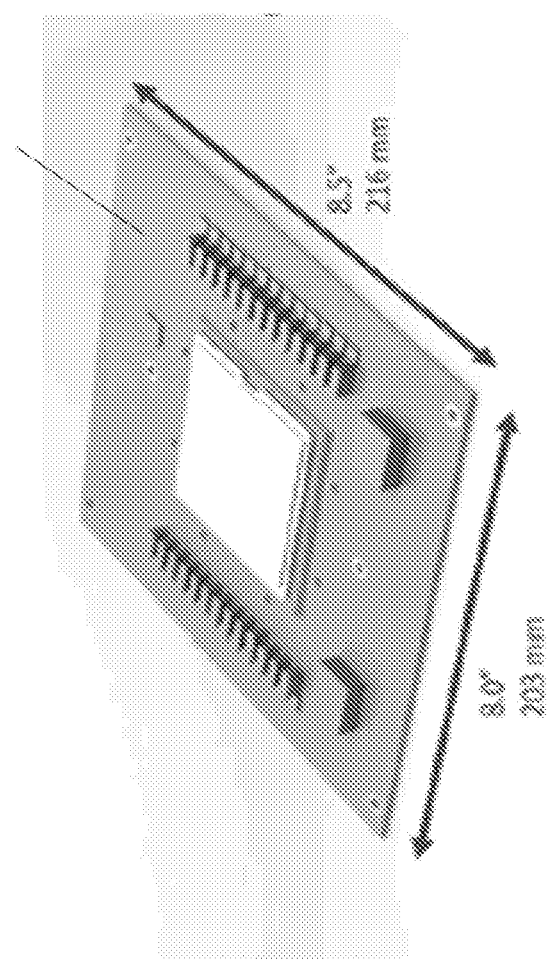
FIG. 9 shows a CPU or GPU card.

As observed in FIG. 9, electronic systems have evolved into the use of "modularized" high performance semiconductor chips such as central processing units (CPUs) and graphics processing units (GPUs). In the case of a modularized CPU or GPU, a high performance semiconductor chip is mounted to a smaller form factor electronic circuit board 901, referred to as a "card". The card may have some supporting electrical components (such as passive capacitors or even active devices such as local memory for the card's high performance chip). The card 901 also includes a card to card connector on the bottom side of the card to attach to a motherboard. The motherboard, for instance, is designed to integrate the function of multiple CPUs/GPUs (through multiple associated CPU/GPU cards) into a single chassis.

Figure 10:
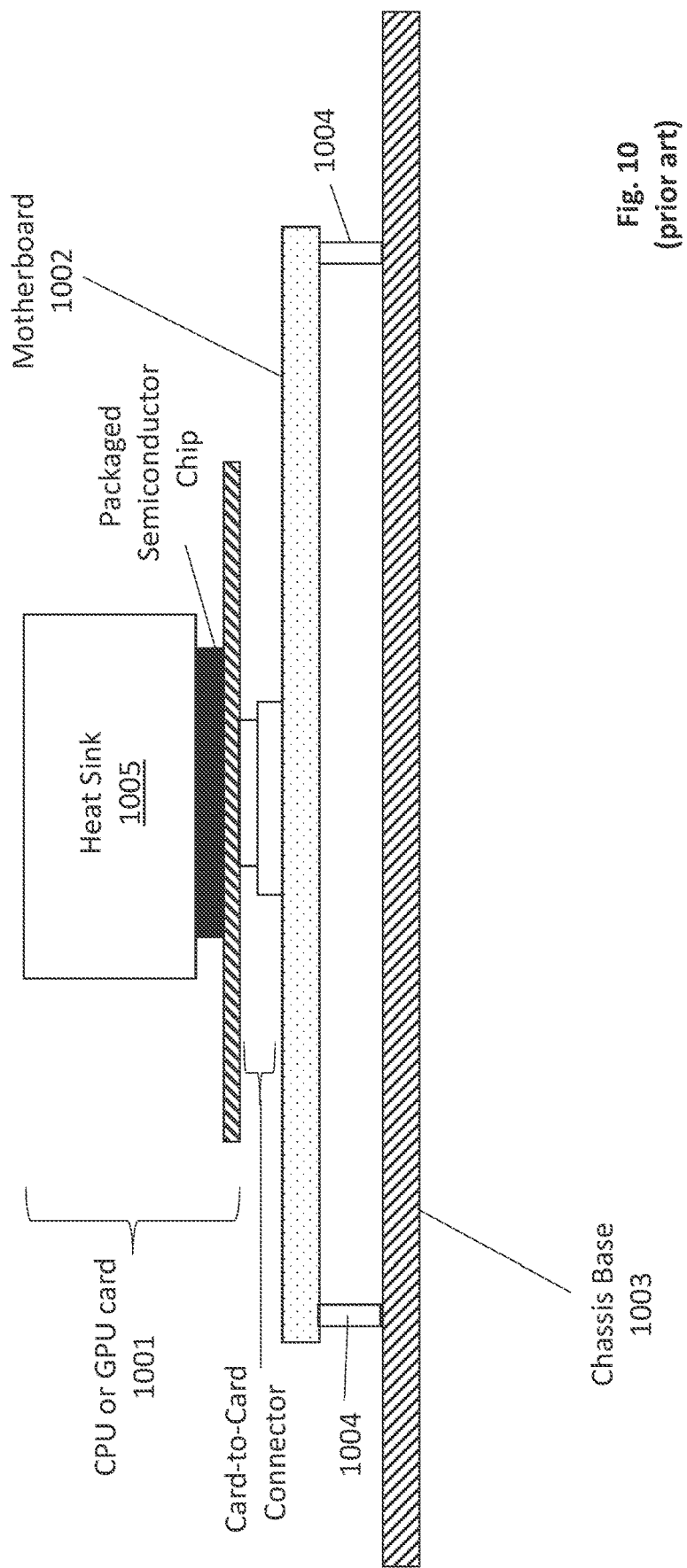
FIG. 10 shows a traditional chassis mount of a motherboard with attached CPU or GPU card.

FIG. 10 shows a traditional card 1001 to motherboard 1002 and corresponding motherboard 1002 to chassis 1003 attachment implementation. As observed in FIG. 10, the card 1001 is single sided in that most/all of the active components (semiconductor chip(s)) are affixed to the topside of the card. The card is then affixed to the motherboard 1002 through the card's bottom side card to card connector and the motherboard's top-side card to card connector. The motherboard may contain additional semiconductor chips on its top side, or, may be composed mainly of internal wiring layers.

The motherboard, depending on the specific system implementation, can be secured to a tray and slid into a chassis, or, mounted directly to a chassis without any tray. With either approach, posts or other supports 1004 exist between the under-side of the motherboard and the chassis (for ease of drawing FIG. 10 does not depict a tray).

Conceivably, the chassis 1003 with integrated motherboard 1002 and card 1001 could be abruptly moved, e.g., during shipment and/or during mounting of the chassis to, e.g., a rack. Any/all such abrupt movements could induce a mechanical load to the overall structure that induces the heat sink 1005 of a mounted card 1001 to move which, in turn, causes the card's circuit board and/or the motherboard 1002 to bend. The bending of either of these electronic circuit boards can damage the wiring within the board(s), and/or, damage I/Os between the card and its semiconductor chip(s) and/or, damage I/Os between the card and the motherboard.

Here, as with embodiments described in the preceding section, such circuit board damage can be avoided by employing an inverted mechanical design in which the heat sink(s) for a card's high performance semiconductor chip(s) are affixed to the chassis. By fixing large mass heat sinks to the chassis, general movement of the heat sinks is avoided thereby eliminating card circuit board damage and/or motherboard damage and/or card-motherboard I/O damage.

Figure 11A:
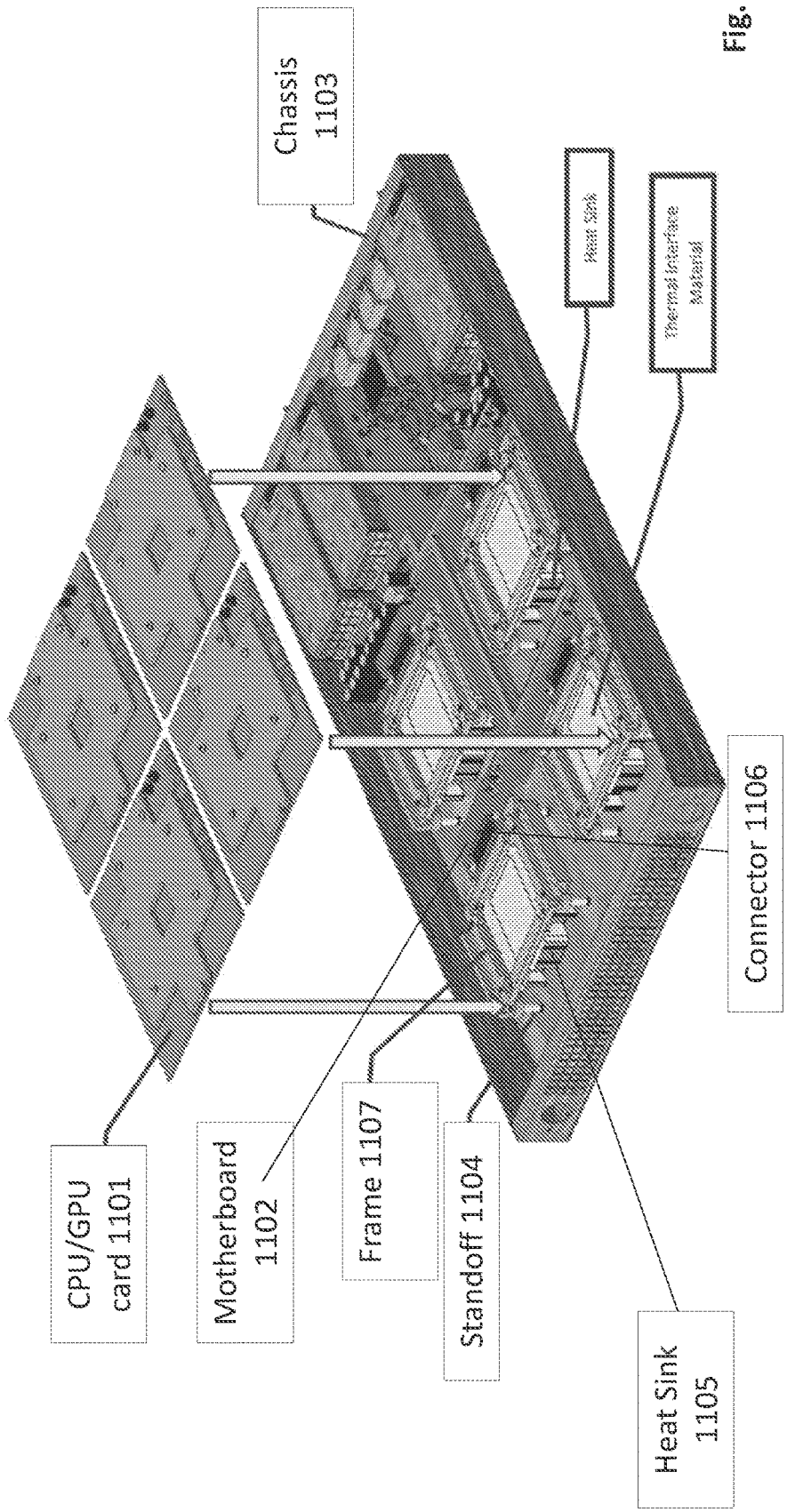
FIG. 11a shows a sixth embodiment of a system with heat sinks that are attached to the chassis.
Figure 11B:
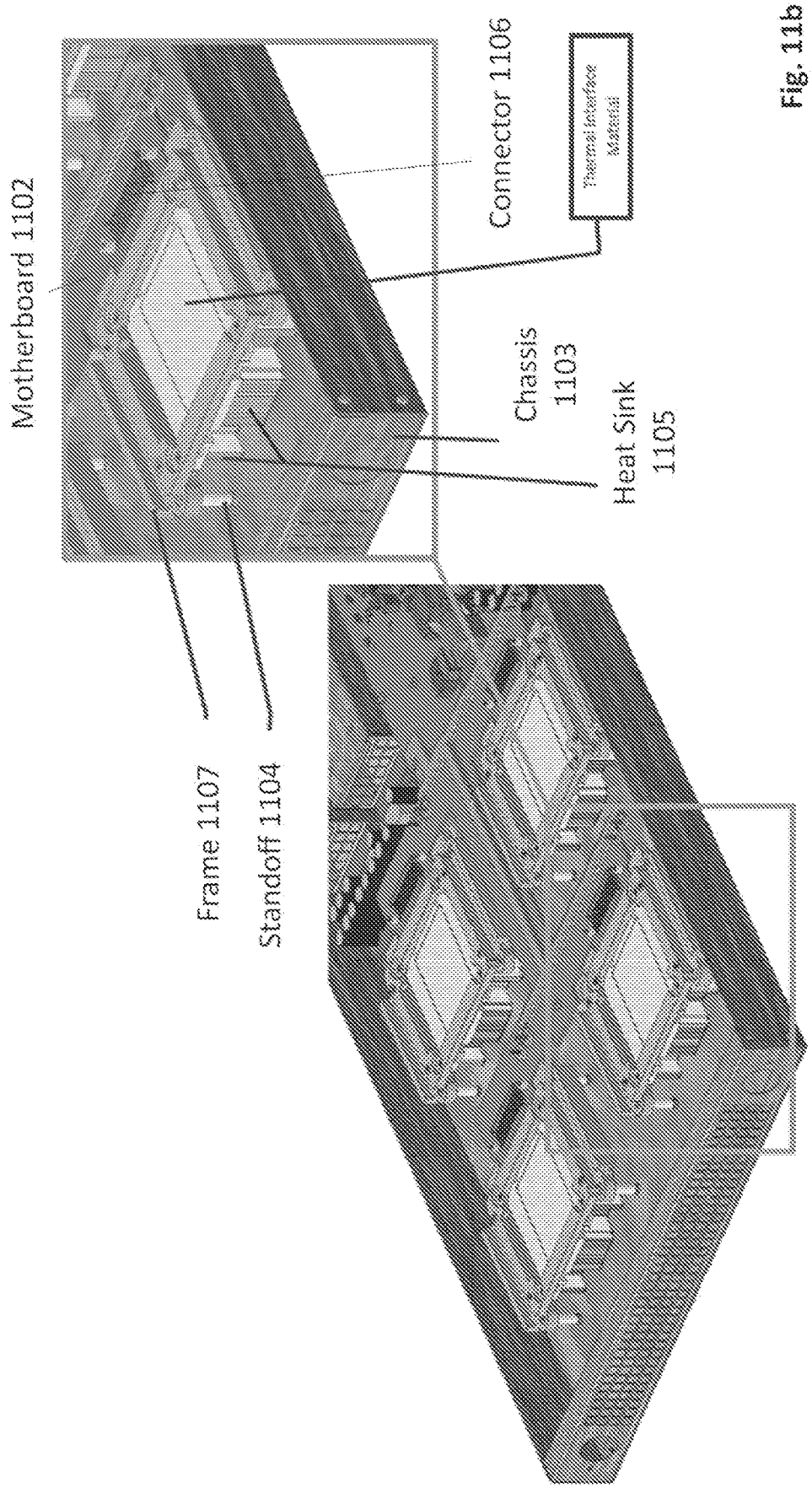
FIG. 11b shows a seventh embodiment of a system with heat sinks that are attached to the chassis.

Thus, according to an improved approach, as depicted in FIGS. 11a and 11b, a heat sink 1105 and its supporting mechanical components 1104 are viewed as components of the chassis 1103 and therefore act to support the motherboard 1102 and card 1101 rather than the motherboard 1102 and card 1101 being designed to support the weight/mass of the heat sink 1105. With such tight mechanical integration of the heat sink 1105 and chassis 1103, any abrupt movement of the chassis 1103 does not induce movement of the heat sink 1105 relative to the chassis 1103 and corresponding bending of the card's board or the motherboard 1102.

Additionally, as described in more detail below, the chassis 1103 can contribute to the cooling of the chip that the heat sink 1105 is coupled to. Card removal and installation is also easier as compared to prior art approaches because, whereas in prior art approaches the heat sink was removed/installed with a card's removal/attachment (because the heat sink was permanently fixed to the card's semiconductor chip), by contrast, in the improved approach, the semiconductor chip/heat sink interface is detachable which corresponds to only the card and chip being removed/installed without the heat sink (which remains attached to the chassis).

FIG. 11a in particular depicts a detailed view of, e.g., a blade system composed of a chassis and motherboard with heat sinks for four individual CPU/GPU cards that are individually plugged into the system (FIG. 11a depicts all four cards being plugged in at the same time). Notably, the motherboard 1102 has a connector 1106 for each card and the chassis 1103 has a heat sink 1105 for each card 1101 that is mechanically aligned with the location of the card's semiconductor chip. Each card's semiconductor chip and connector are not visible because they are on the underside of the card as depicted. The heat sink surface that interfaces with the semiconductor chip may include thermal interfacing material (e.g. heat sink gel or paste or other material) to improve the thermal transfer coupling between the heat sink interface and the chip lid.

Referring to FIG. 11b, a heat sink 1105 is mounted to a frame 1107 and the frame 1107 is mounted to the chassis through stand-offs 1104 located at each corner of the frame 1107. Each stand off 1104 is hollow along its axis. A hole at each corner of the frame 1107 aligns with the hollow opening of the stand off 1104. A screw or bolt is inserted through both holes and then tightened to rigidly attach the particular corner of the frame 1107 and heat sink 1105 to the chassis 1103. The attachment may be enhanced with a spring (e.g., coil, torsion, leaf, etc.) or other component that is mechanically coupled with the screw/bolt. The frame can also include holes (threaded or otherwise) on its top-side that align with holes in the card. Screws/bolts are inserted through the holes in the card and anchored in the aligned holes in the frame to anchor the card to the frame 1107.

The face of the heat sink 1105 that faces the bottom of the chassis 1103 may or may not be in contact with the bottom of the chassis 1103. In the case of the former, e.g., in the case of air cooled systems, more air is allowed to pass over the heat sink surface area. In the case of the latter, the chassis is thermally coupled to the heat sink and potentially adds to the mass that draws heat from the chip. In various embodiments that use a liquid cooled approach, the heat sink is replaced with a cold plate and a manifold. The manifold has a liquid input port and a liquid output port. Cooled fluid flows into the input port and is warmed by heat from the chip which has been drawn into the plate. The warmed fluid then flows from the output port to a heat exchanger that cools the fluid and the process repeats.

Figure 12:
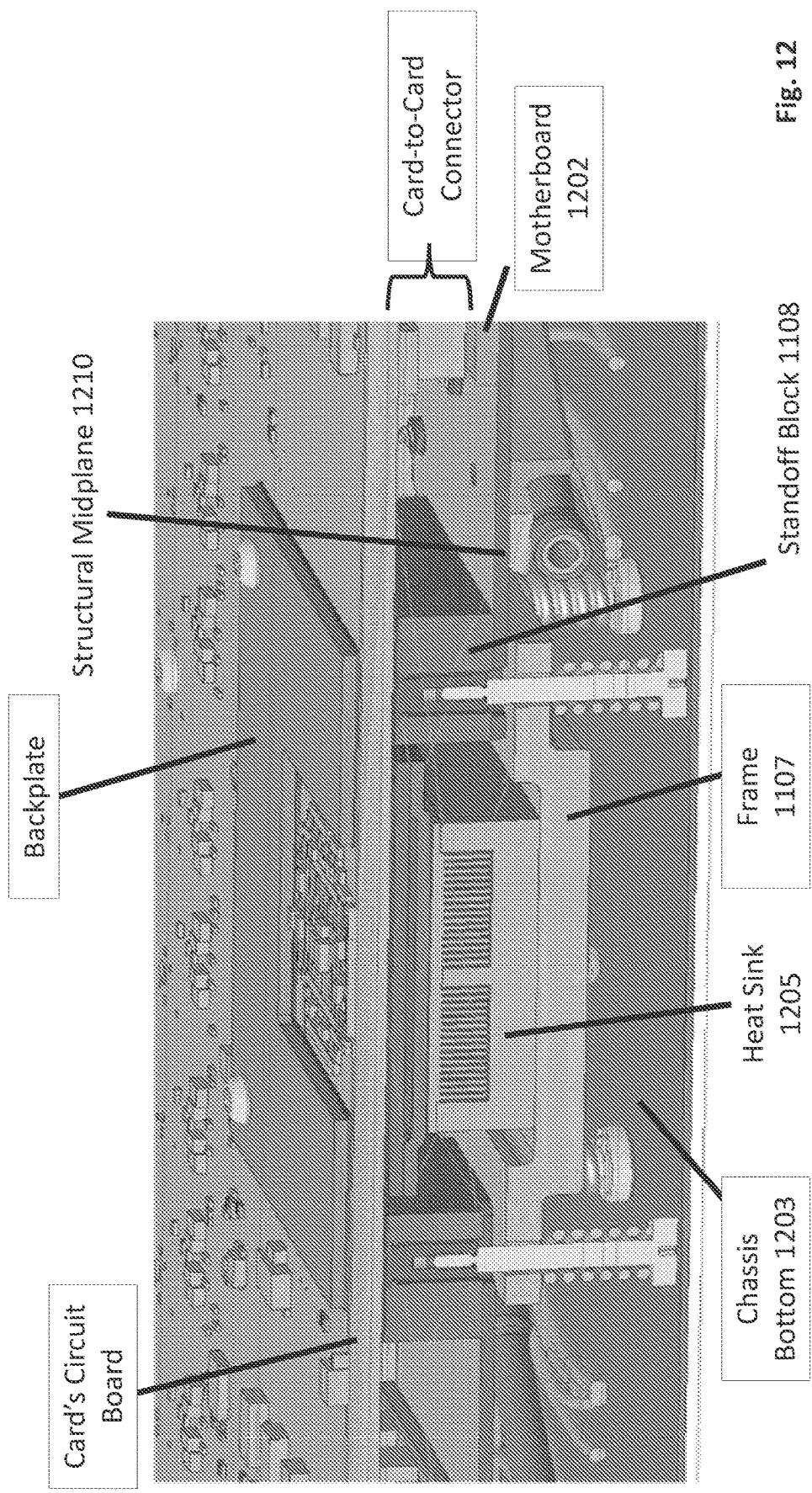
FIG. 12 shows a structural mid-plane.

FIG. 12 shows a further embodiment where a structural midplane 1210 is positioned between the bottom of the chassis 1203 and the card. The height of the midplane 1210 from the bottom of the chassis 1103 is established by the thickness of the corner flanges of the heat sink frame 1107 and the length of the respective coil springs for the bolts which feed through the heat sink frame 1107. Standoff blocks 1108 mounted to the top-side of the structural midplane 1210 establish a physical base/floor for the card. Screws/bolts that are inserted through holes in the card (and, in various embodiments, through aligned holes in a back plate of the card) can be tightened in threaded holes of the standoff blocks 1108 to provide further mechanical anchoring of the card (e.g., apart from the card-to-card connector).

In an embodiment, the structural midplane 1210 is a single metal (or other hard material) plane through which more than one heat sink are coupled to the bottom of the chassis. So doing adds structural support to the group of heat sink frames as a unit (by preventing relative movement amongst multiple frames). Additionally, the structural midplane 1210 can provide mechanical support for standoffs and/or any screws/bolts that thread through the frames (by preventing them from bending). In liquid cooled approaches, various system cooling features (e.g., hoses) can be attached to the structural midplane 1210 for support or other various system features (e.g., electrical power/ground wires) can be laid out on and attached to the structural midplane 1210.

FIGS. 13a through 13d depict a process for assembling an inverted card to card system as discussed above. As observed in FIGS. 13a and 13b, a frame (or frame and supporting standoffs) is attached to the chassis floor and a heat sink is attached to the frame.

Figures 13A, 13B:
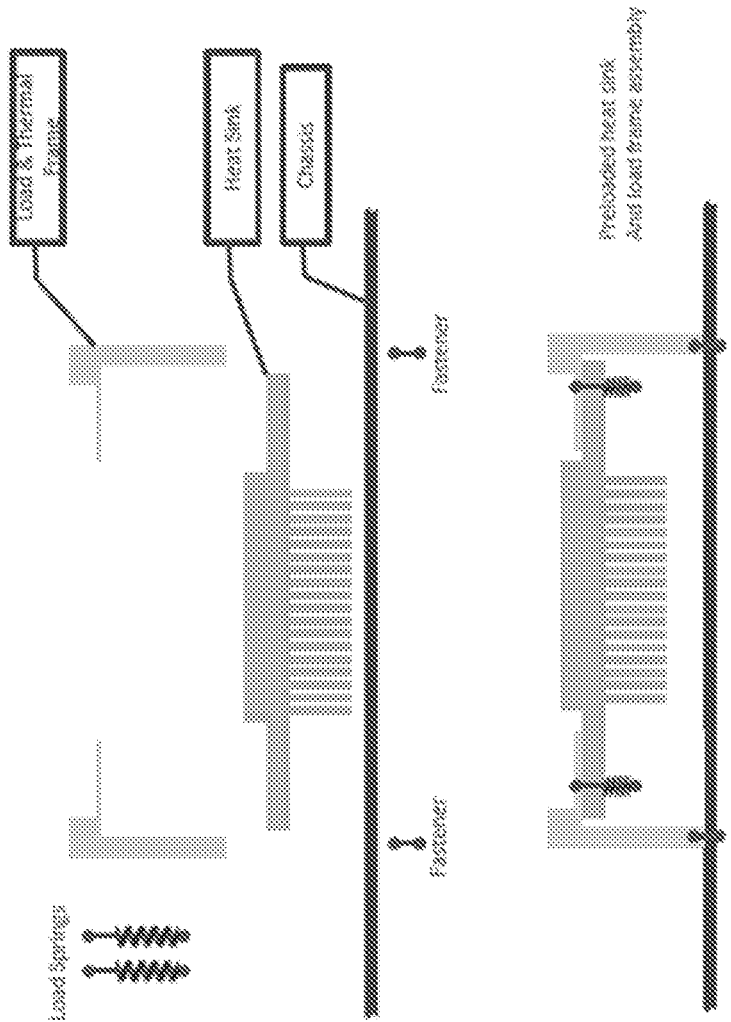
FIG. 13a through 13e show a method of manufacturing a system with heat sinks that are attached to the chassis.
Figures 13C, 13D, 13E:
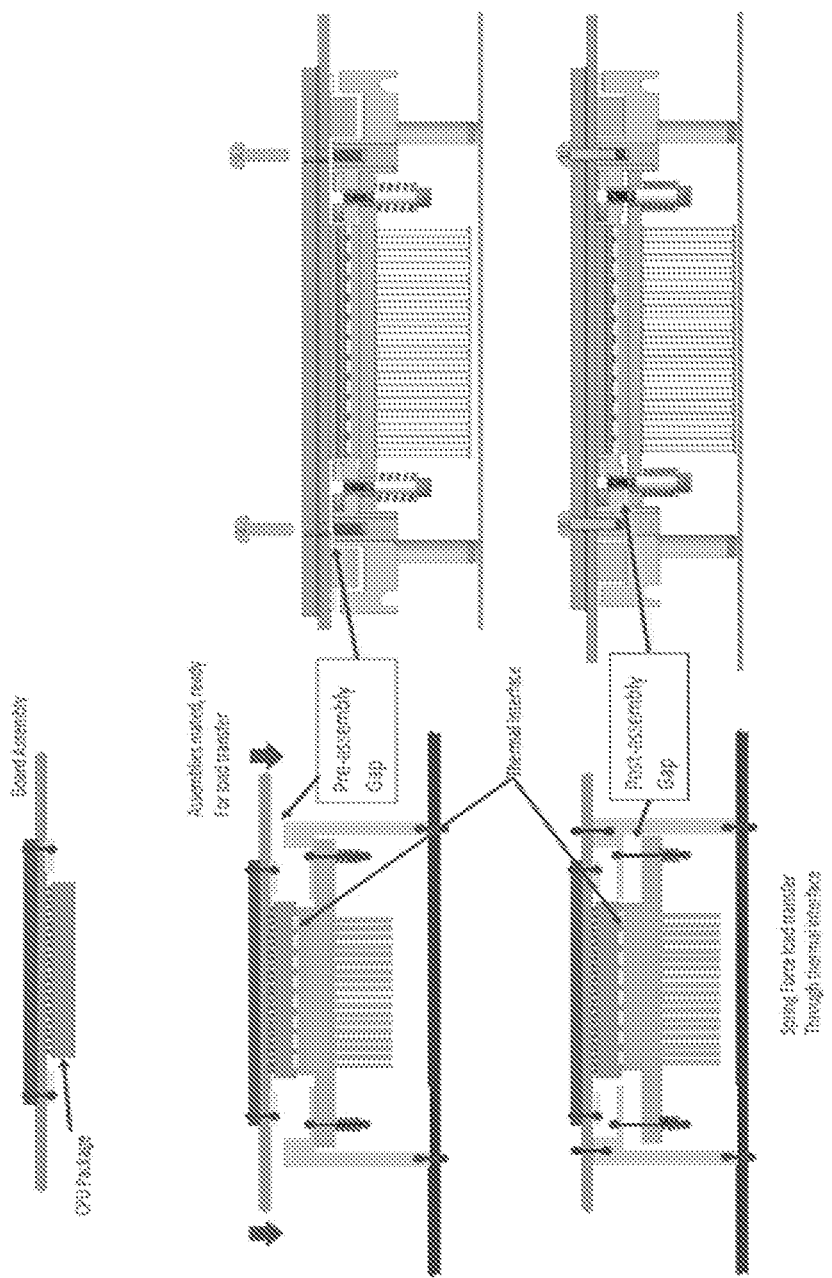

Then, as observed in FIG. 13c, a card with packaged semiconductor chip but no heat sink is inverted. Then, as observed in FIGS. 13d and 13e, the card is mated to the system which includes the semiconductor chip package lid mating with the heat sink (or cold plate) and mating the card-to-card connector ends between the card and motherboard (for illustrative ease, the motherboard is not depicted in FIGS. 13a through 13d). Here, as seen in FIG. 13d, there is a designed for gap between the card and the frame (or floor standoff supported by a structural midplane) when the card is merely aligned and resting on the frame/standoff.

As the card/motherboard is firmly attached to the frame/standoff by torqueing down on bolts/screws of the card that are threaded in holes in the frame/standoff (and/or screws/bolts of the motherboard that feed into the frame/standoff or other structure that is mounted to the chassis), the lid of the semiconductor chip presses firmly against the heat sink (which can evenly spread heat sink gel/paste between the lid and heat sink), the card's card-to-card connector presses firmly against the motherboard's card-to-card connector (not shown) and the designed for gap substantially disappears. Besides ensuring a good thermal coupling between the chip lid and the heat sink, the designed for gap also allows for some tolerance of chip package heights, heat sink thickness, standoff frame height and/or thicknesses, etc.

Figure 14:
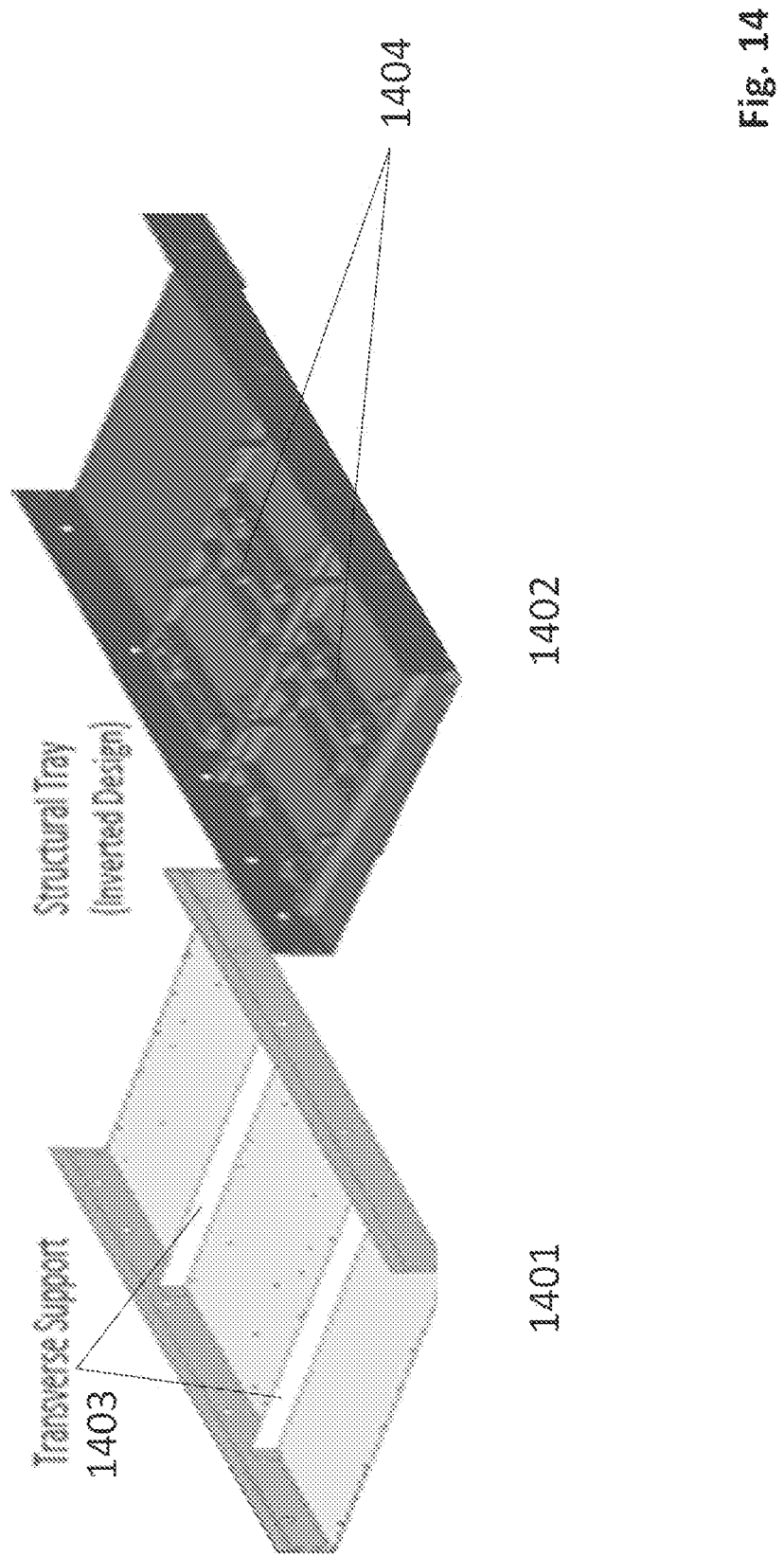
FIG. 14 show trays with transverse support.

FIG. 14 shows embodiments of improved tray designs that help prevent tray deformity (and therefore motherboard and/or CPU/GPU card stresses). As observed in FIG. 14, a tray 1401 with transverse support(s) 1403 will help prevent or diminish the tray's bottom face from warping. Notably, heat sink structures and/or their frames 1404 if added to a tray pan, as observed in embodiment 1402, similarly provide transverse support like structures 1403. That is, because the heat sink/frame structures 1401 extend widthwise from one edge of the pan to the opposite edge of the pan, and because the heat sink/frame structures 1404 have a substantial mass/thickness that prevents them from bending easily, their attachment to the pan tray helps prevent the pan from warping much like structures 1403 of embodiment 1401. Because of such support, conceivably thinner or less expensive tray materials can be used (e.g., carbon fiber, EMI shielded/filled polymer, etc.).

Figure 15:
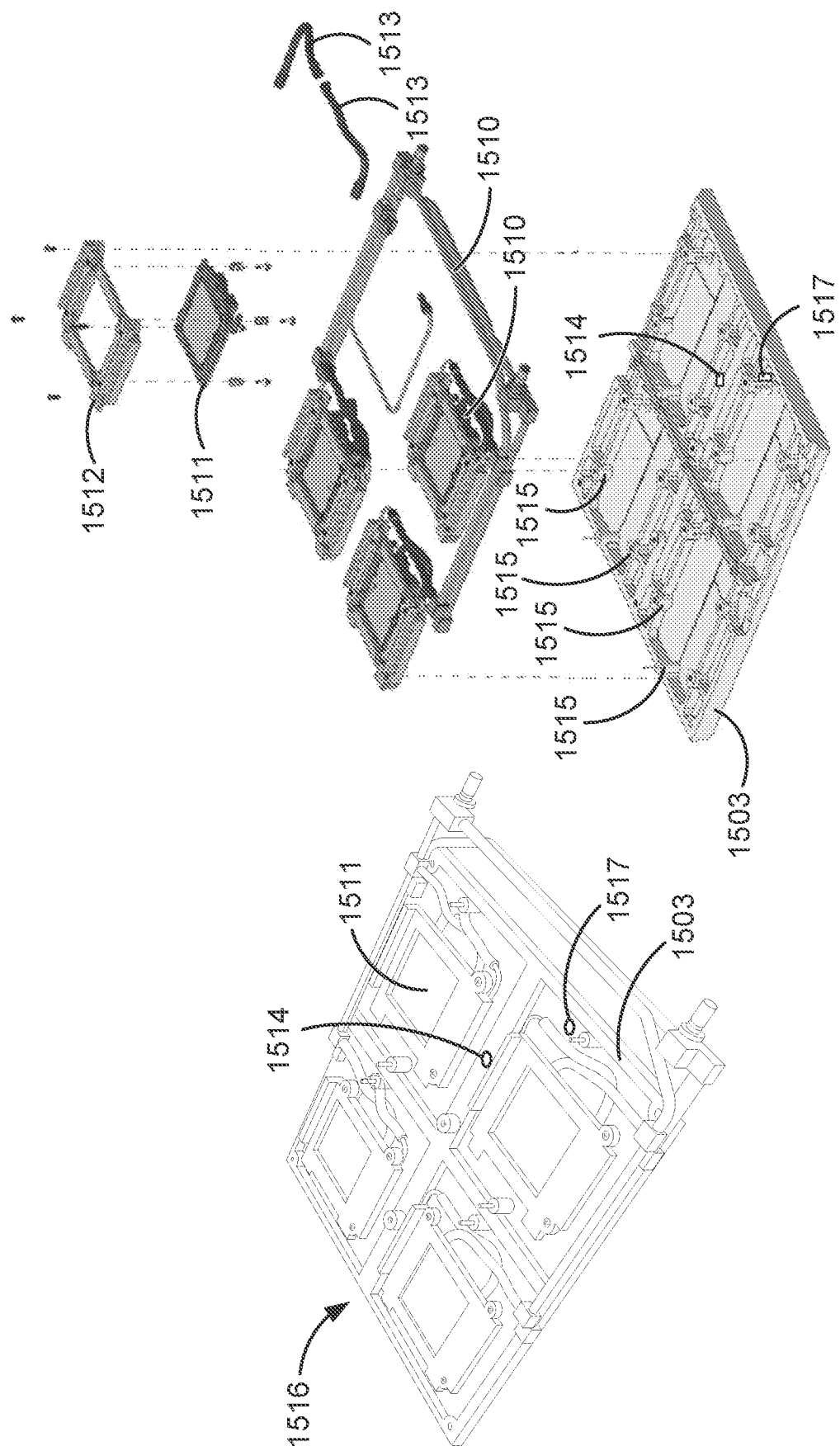
FIG. 15 shows a system with a structured chassis floor.
Figure 16A:
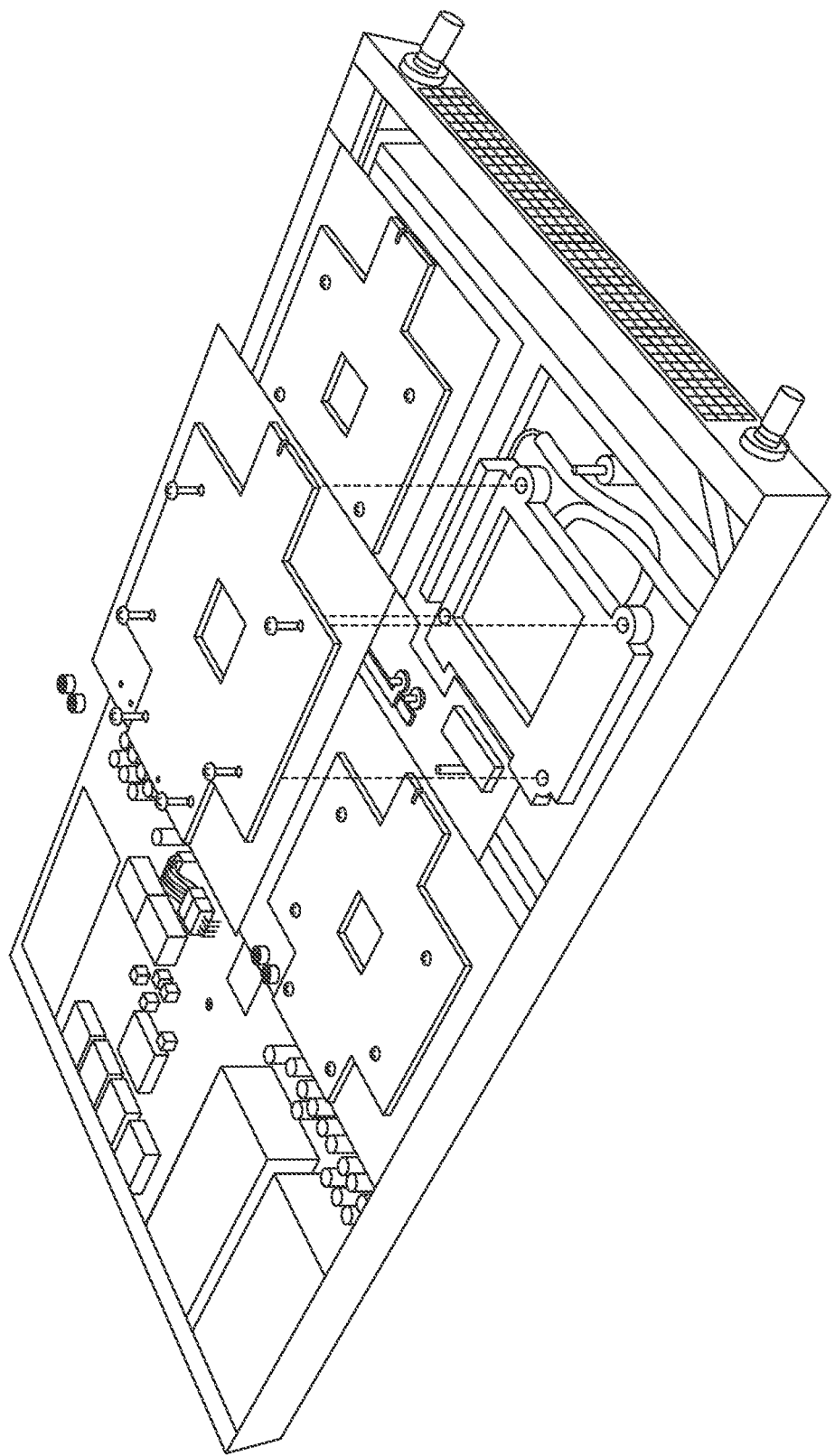
FIGS. 16a, 16b, 16c and 16d show different views of a system with a structured chassis floor.
Figure 16B:
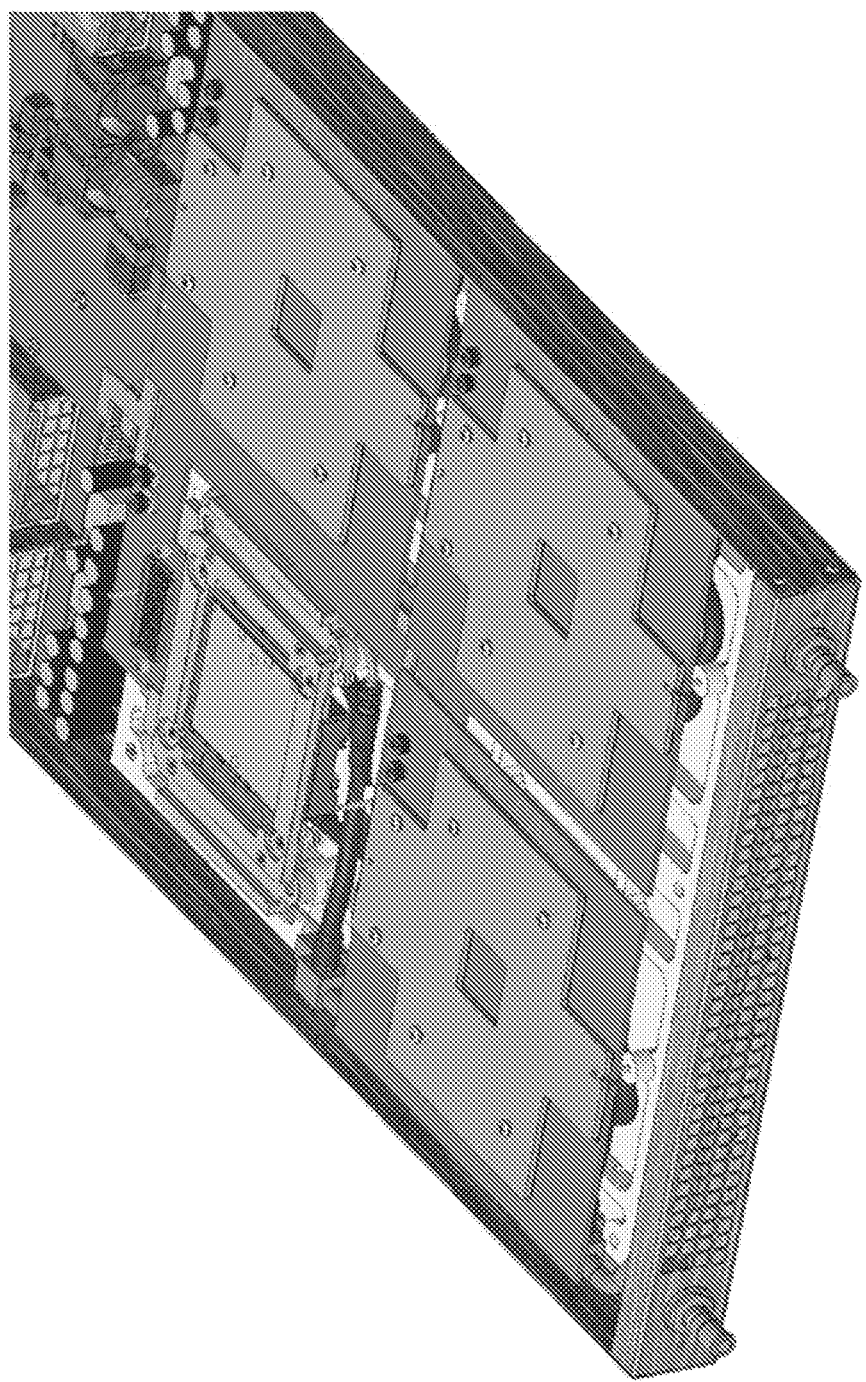
Figure 16C:
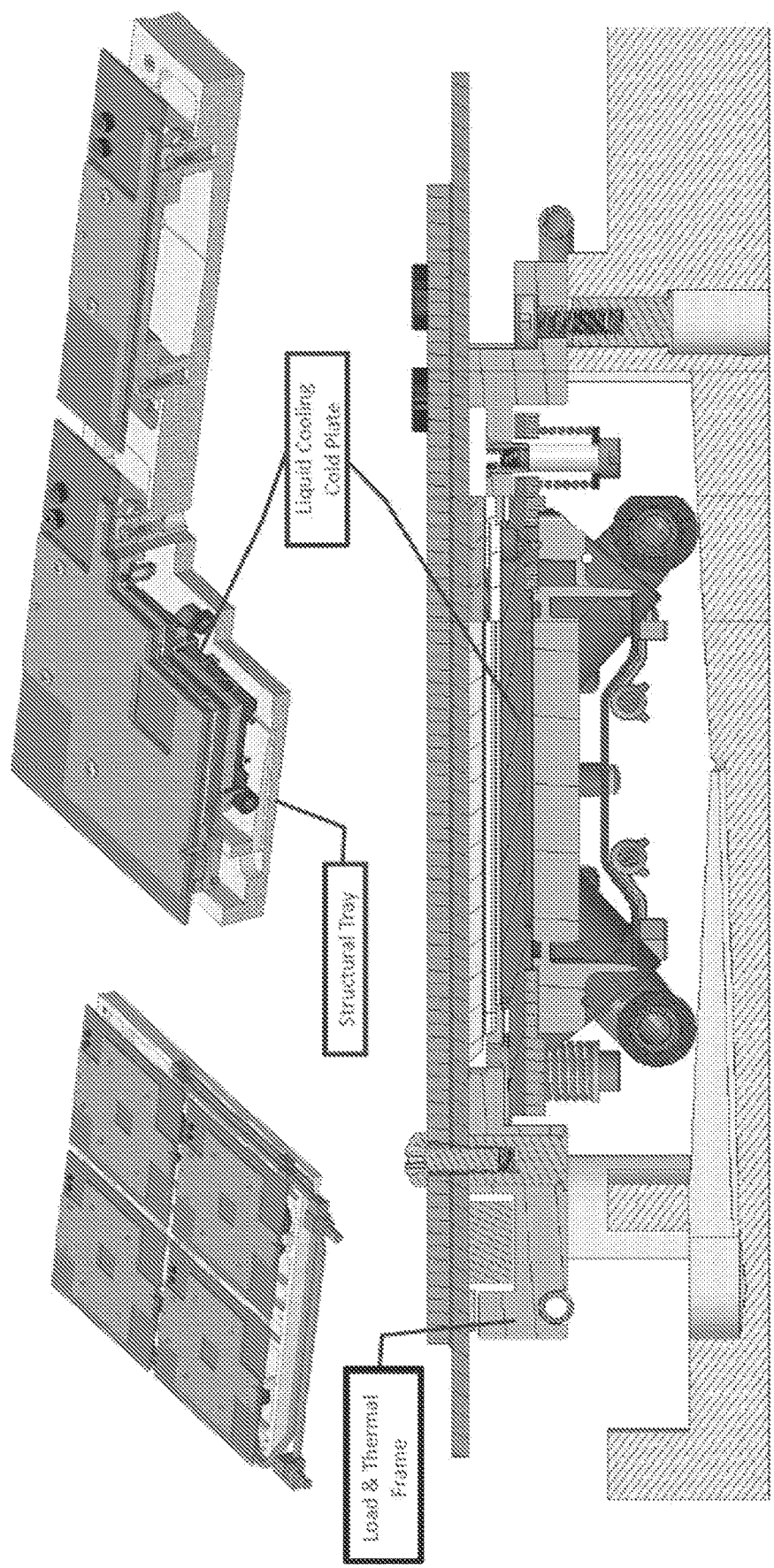
Figure 16D:
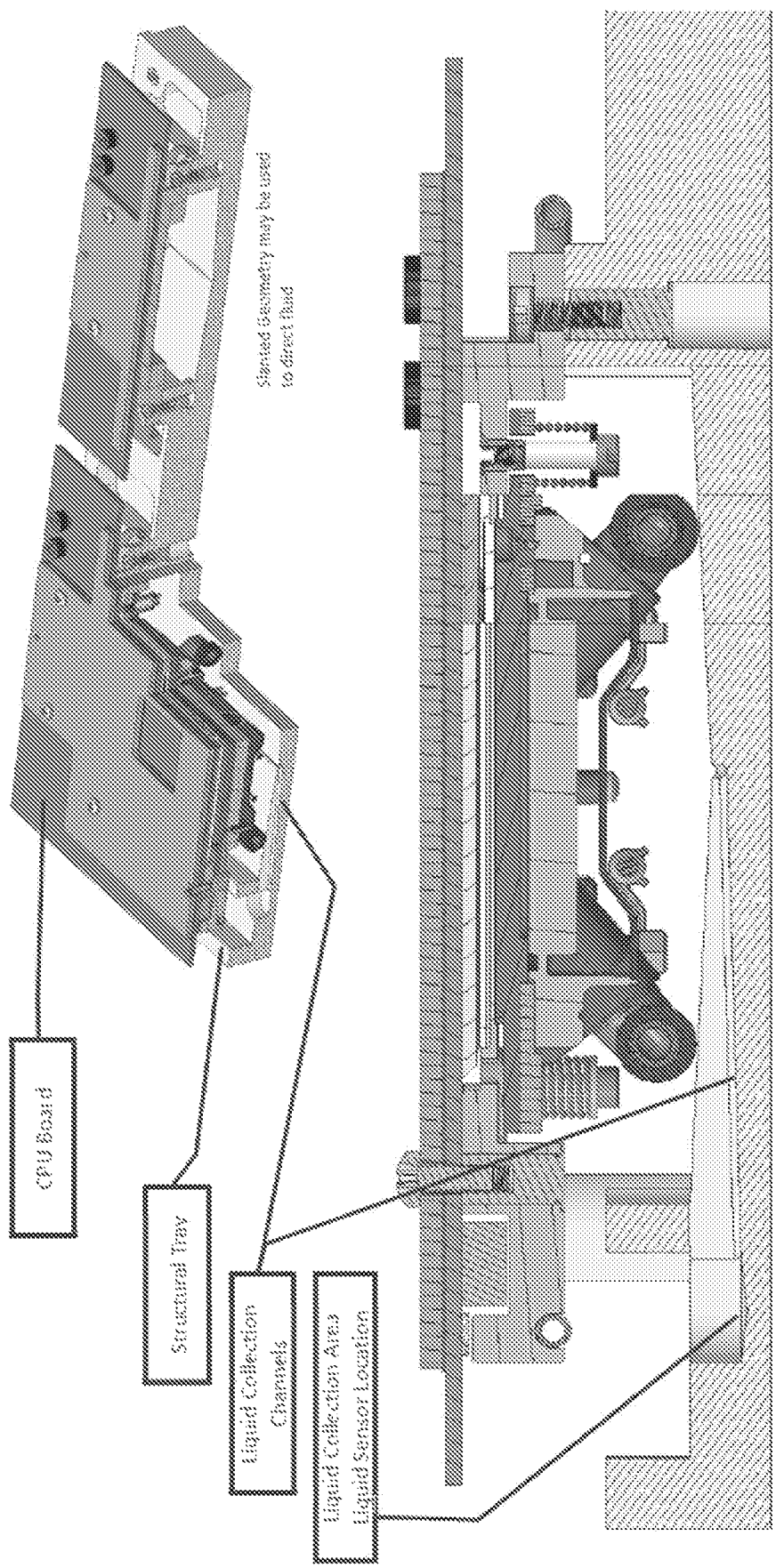

In further embodiments, referring to FIG. 15, the tray can be "structured", e.g., molded with frame-like and/or standoff features on its bottom surface to which a heat sink or liquid cooling manifold (or cold plate) is to attach and that provide stability to the heat sink and tray pan. Here, structures are formed (e.g., molded) in the bottom surface of the tray 1503 that mate with the manifold components 1510 of a liquid cooling system that uses multiple components (manifold 1510 and cold plate 1511) to transfer heat from a card's semiconductor chip into a liquid coolant. Each manifold component includes a liquid input port and a liquid output port which couples to the cooling system's tubing. The cold plate 1511 connects to the manifold component via these inlet and outlet ports, or by means of tubing flexible hoses 1513.

A frame 1512 without legs is placed over the upper cold plate component. The frame can be rigidly affixed to the cold plate, manifold, tray surface features or any combination thereof (e.g., depending on the length of the anchor bolts/screws). An inverted card then mates to the cold plate with the lid package of the card's semiconductor chip being thermally coupled to the cold plate (thermal interface material (e.g., a gel or paste) may be placed between the two). FIGS. 16a through 16d show more detailed drawings of a completed system (as opposed to the exploded view of FIG. 15).

In various embodiments, the bolts/screws described above are replaced with respective keyhole studs with integrated lever action. When a tool having a face that mates with the keyhole is inserted into the keyhole and turned, the integrated lever action rotates and secures the associated assembly in place.

Besides the support provided to the cooling apparatus (again, frame legs and/or standoffs are essentially replaced with features formed into the bottom surface of the tray) and the tray (e.g., via transverse support), the structured features can be formed to strategically direct air flow through the heat sinks in air cooled systems, or, in the case of liquid cooling approaches, the features can be shaped to collect and "run off" any fluidic leaks in the cooling system away from the electronics. In the case of the latter, liquid sensors can be embedded in the tray features to detect any such leaks. Further elements of the features can include cable clips (represented by the circle identified by reference number 1514), cable conduit routing corridors, attach points 1515 (e.g., guide features) for loading/assembly tools, guide pins for loading/assembly tools or multiple board alignment, finger access spaces, molded-in light pipes, molded-in bus bars, fasteners, inserts, embedded detectors (e.g., liquid detector, thermocouple, etc.) represented by the circle identified by reference number 1517.

3.0 Closing Comments

A heat sink, liquid cooling manifold, liquid cooling cold plate (or other plate) can each more generally be referred to as a semiconductor chip cooling component. The packaged semiconductor chip that is to be cooled by the cooling component is electro-mechanically connected to its respective printed circuit board (e.g., a double sided circuit board as described in Section 1.0 above or a CPU or GPU card as described in Section 2.0 above) through any of a number of I/O options such as ball grid array (BGA), micro-balls, land grid array (LGA), pin grid array (PGA), J-leads, etc.

Various features described in Section 1.0 above can be combined with the teachings of Section 2.0 above (e.g., a structured chassis face, a structured midplane, etc.). Likewise, various features described in Section 2.0 above can be combined with the teachings of Section 1.0 above (e.g., various spring loaded attachments between a heat sink or frame and chassis and/or CPU/GPU card).

Although embodiments above have stressed cards having CPUs or GPUs, it is pertinent to point out that any, e.g., high density large scale semiconductor chip could be disposed on a card (e.g., system-on-chip, accelerator chip (e.g., neural network processor), general purpose graphics processing unit (GPGPU), field programmable gate array (FPGA), application specific integrated circuit (ASIC), etc.

Any chassis discussed above can have dimensions that are compatible with an industry standard rack (such as racks having 19" or 23" widthwise openings and having mounting holes for chassis having heights of specific height units (e.g., 1U, 2U, 3U where U=1.75"). One examples is the IEC 60297 Mechanical structures for electronic equipment—Dimensions of mechanical structures of the 482.6 mm (19 in) series. Generally, however, a chassis of any dimension is possible.

The electrical I/Os of the card to card connectors described above (or input/output interfaces to the chassis described above) may be compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

The chassis described above may contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 17:
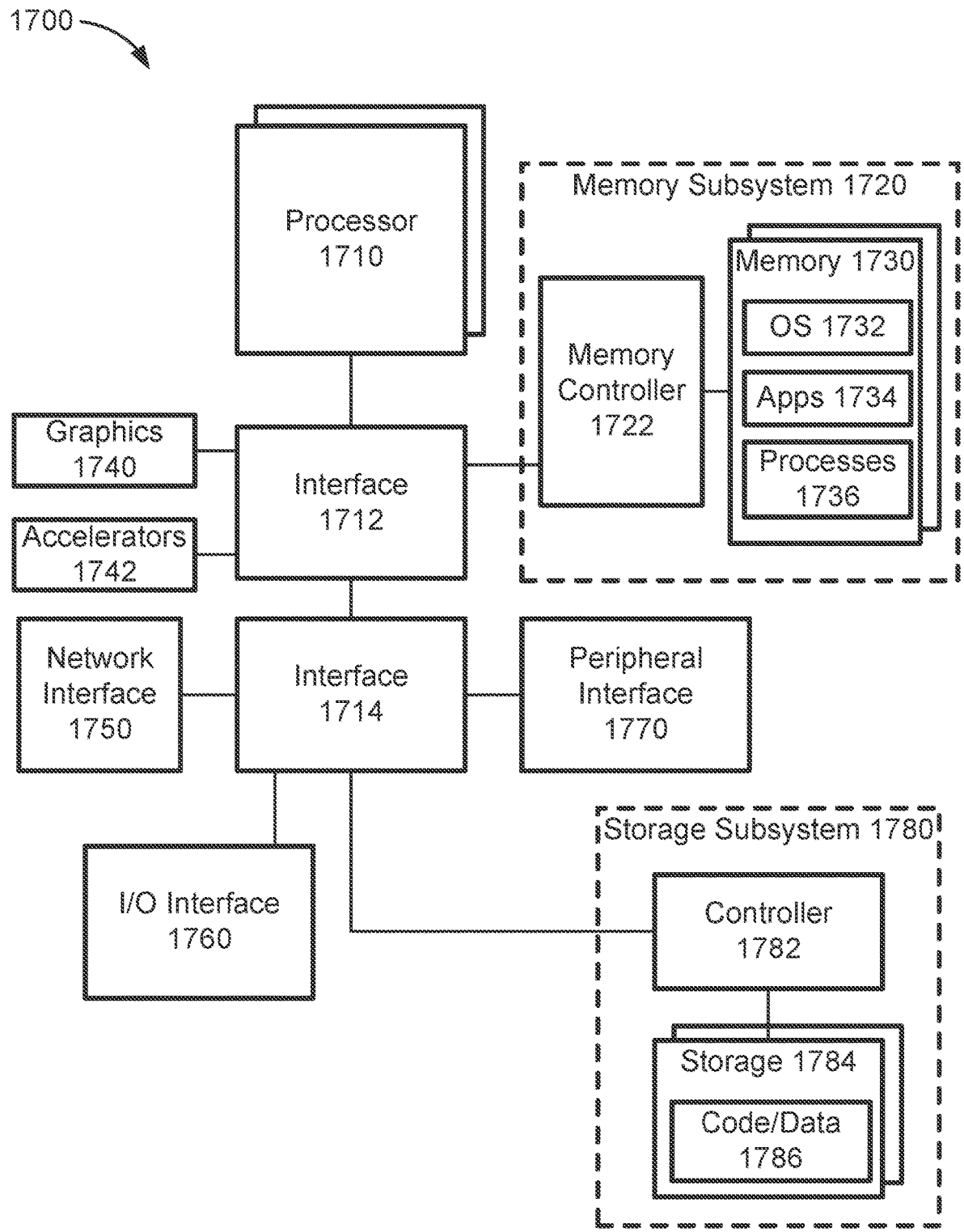
FIG. 17 shows a computer system.

FIG. 17 depicts an example system. The system can use embodiments described herein to determine a reference voltage to apply to a rank of memory devices and a timing delay of a chip select (CS) signal sent to the rank of memory devices. System 1700 includes processor 1710, which provides processing, operation management, and execution of instructions for system 1700. Processor 1710 can include any type of microprocessor, central processing unit (CPU), graphics processing unit (GPU), processing core, or other processing hardware to provide processing for system 1700, or a combination of processors. Processor 710 controls the overall operation of system 1700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1700 includes interface 1712 coupled to processor 1710, which can represent a higher speed interface or a high throughput interface for system components that needs higher bandwidth connections, such as memory subsystem 720 or graphics interface components 1740, or accelerators 1742. Interface 1712 represents an interface circuit, which can be a standalone component or integrated onto a processor die. Where present, graphics interface 1740 interfaces to graphics components for providing a visual display to a user of system 1700. In one example, graphics interface 1740 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1740 generates a display based on data stored in memory 1730 or based on operations executed by processor 1710 or both. In one example, graphics interface 1740 generates a display based on data stored in memory 1730 or based on operations executed by processor 1710 or both.

Accelerators 1742 can be a fixed function offload engine that can be accessed or used by a processor 1710. For example, an accelerator among accelerators 1742 can provide compression (DC) capability, cryptography services such as public key encryption (PKE), cipher, hash/authentication capabilities, decryption, or other capabilities or services. In some embodiments, in addition or alternatively, an accelerator among accelerators 1742 provides field select controller capabilities as described herein. In some cases, accelerators 1742 can be integrated into a CPU socket (e.g., a connector to a motherboard or circuit board that includes a CPU and provides an electrical interface with the CPU). For example, accelerators 1742 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 1742 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1720 represents the main memory of system 1700 and provides storage for code to be executed by processor 710, or data values to be used in executing a routine. Memory subsystem 1720 can include one or more memory devices 1730 such as read-only memory (ROM), flash memory, volatile memory, or a combination of such devices. Memory 730 stores and hosts, among other things, operating system (OS) 1732 to provide a software platform for execution of instructions in system 1700. Additionally, applications 734 can execute on the software platform of OS 1732 from memory 1730. Applications 1734 represent programs that have their own operational logic to perform execution of one or more functions. Processes 1736 represent agents or routines that provide auxiliary functions to OS 1732 or one or more applications 1734 or a combination. OS 1732, applications 1734, and processes 1736 provide software logic to provide functions for system 700. In one example, memory subsystem 1720 includes memory controller 1722, which is a memory controller to generate and issue commands to memory 1730. It will be understood that memory controller 1722 could be a physical part of processor 710 or a physical part of interface 1712. For example, memory controller 1722 can be an integrated memory controller, integrated onto a circuit with processor 1710. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 1700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 1700 includes interface 1714, which can be coupled to interface 1712. In one example, interface 1714 represents an interface circuit, which can include standalone components and integrated circuitry. In one example, multiple user interface components or peripheral components, or both, couple to interface 1714. Network interface 1750 provides system 1700 the ability to communicate with remote devices (e.g., servers or other computing devices) over one or more networks. Network interface 1750 can include an Ethernet adapter, wireless interconnection components, cellular network interconnection components, USB (universal serial bus), or other wired or wireless standards-based or proprietary interfaces. Network interface 1750 can transmit data to a remote device, which can include sending data stored in memory. Network interface 1750 can receive data from a remote device, which can include storing received data into memory. Various embodiments can be used in connection with network interface 1750, processor 1710, and memory subsystem 1720.

In one example, system 1700 includes one or more input/output (I/O) interface(s) 1760. I/O interface 1760 can include one or more interface components through which a user interacts with system 1700 (e.g., audio, alphanumeric, tactile/touch, or other interfacing). Peripheral interface 1770 can include any hardware interface not specifically mentioned above. Peripherals refer generally to devices that connect dependently to system 1700. A dependent connection is one where system 1700 provides the software platform or hardware platform or both on which operation executes, and with which a user interacts.

In one example, system 1700 includes storage subsystem 1780 to store data in a nonvolatile manner. In one example, in certain system implementations, at least certain components of storage 780 can overlap with components of memory subsystem 1720. Storage subsystem 1780 includes storage device(s) 784, which can be or include any conventional medium for storing large amounts of data in a nonvolatile manner, such as one or more magnetic, solid state, or optical based disks, or a combination. Storage 1784 holds code or instructions and data 1786 in a persistent state (i.e., the value is retained despite interruption of power to system 1700). Storage 1784 can be generically considered to be a "memory," although memory 1730 is typically the executing or operating memory to provide instructions to processor 1710. Whereas storage 1784 is nonvolatile, memory 1730 can include volatile memory (i.e., the value or state of the data is indeterminate if power is interrupted to system 1700). In one example, storage subsystem 1780 includes controller 1782 to interface with storage 1784. In one example controller 1782 is a physical part of interface 1714 or processor 1710 or can include circuits or logic in both processor 1710 and interface 1714.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1700. More specifically, power source typically interfaces to one or multiple power supplies in system 1700 to provide power to the components of system 1700. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1700 can be implemented using interconnected compute sleds of processors, memories, storages, network interfaces, and other components. High speed interconnects can be used such as PCIe, Ethernet, or optical interconnects (or a combination thereof).

Figure 18:
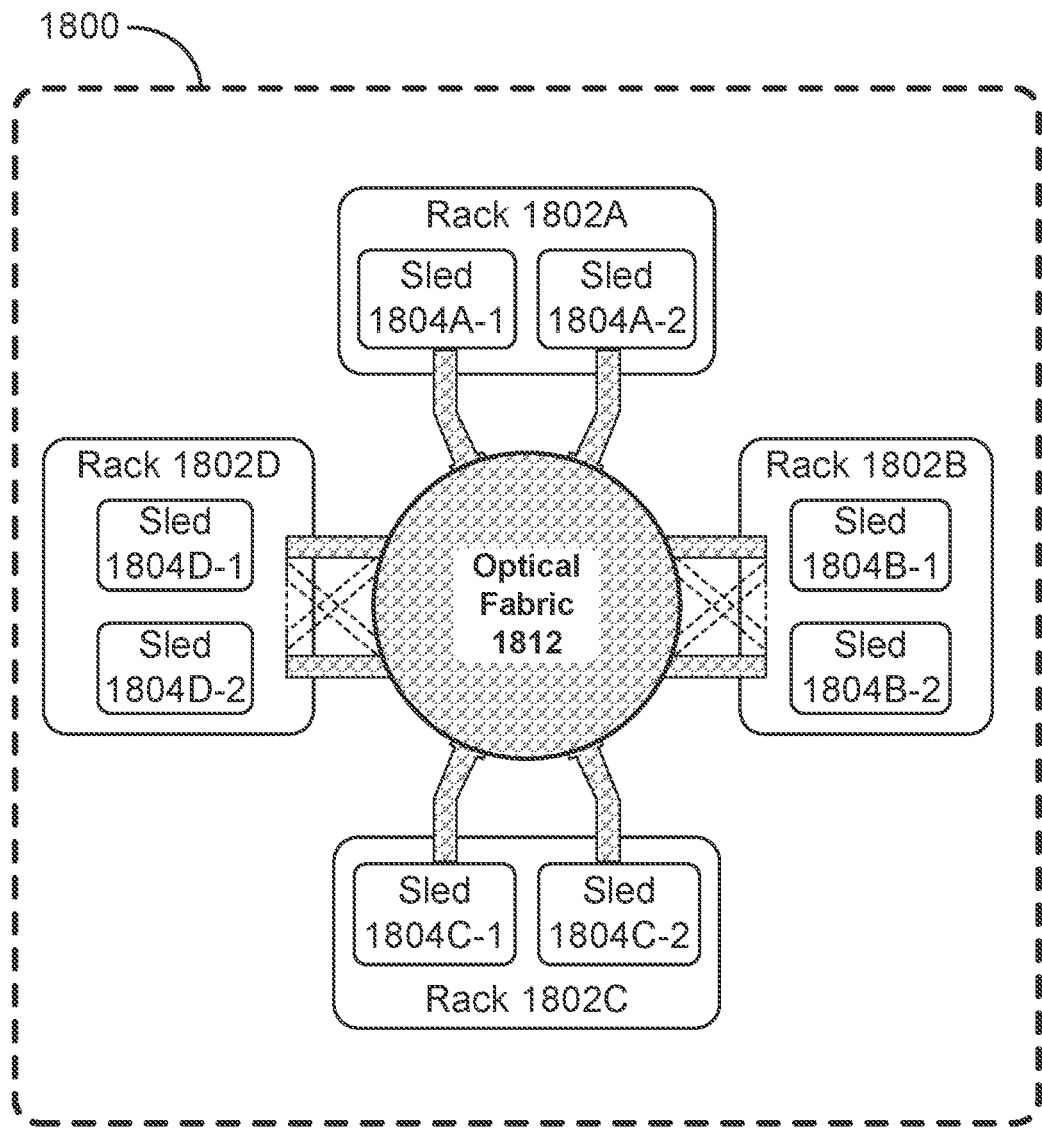
FIG. 18 shows a data center.

FIG. 18 depicts an example of a data center. Various embodiments can be used in or with the data center of FIG. 18. As shown in FIG. 18, data center 1800 may include an optical fabric 1812. Optical fabric 1812 may generally include a combination of optical signaling media (such as optical cabling) and optical switching infrastructure via which any particular sled in data center 1800 can send signals to (and receive signals from) the other sleds in data center 1800. However, optical, wireless, and/or electrical signals can be transmitted using fabric 1812. The signaling connectivity that optical fabric 1812 provides to any given sled may include connectivity both to other sleds in a same rack and sleds in other racks. Data center 1800 includes four racks 1802A to 1802D and racks 1802A to 1802D house respective pairs of sleds 1804A-1 and 1804A-2, 1804B-1 and 1804B-2, 1804C-1 and 1804C-2, and 1804D-1 and 1804D-2. Thus, in this example, data center 1800 includes a total of eight sleds. Optical fabric 1812 can provide sled signaling connectivity with one or more of the seven other sleds. For example, via optical fabric 1812, sled 1804A-1 in rack 1802A may possess signaling connectivity with sled 1804A-2 in rack 1802A, as well as the six other sleds 1804B-1, 1804B-2, 1804C-1, 1804C-2, 1804D-1, and 1804D-2 that are distributed among the other racks 1802B, 1802C, and 1802D of data center 1800. The embodiments are not limited to this example. For example, fabric 1812 can provide optical and/or electrical signaling.

Figure 19:
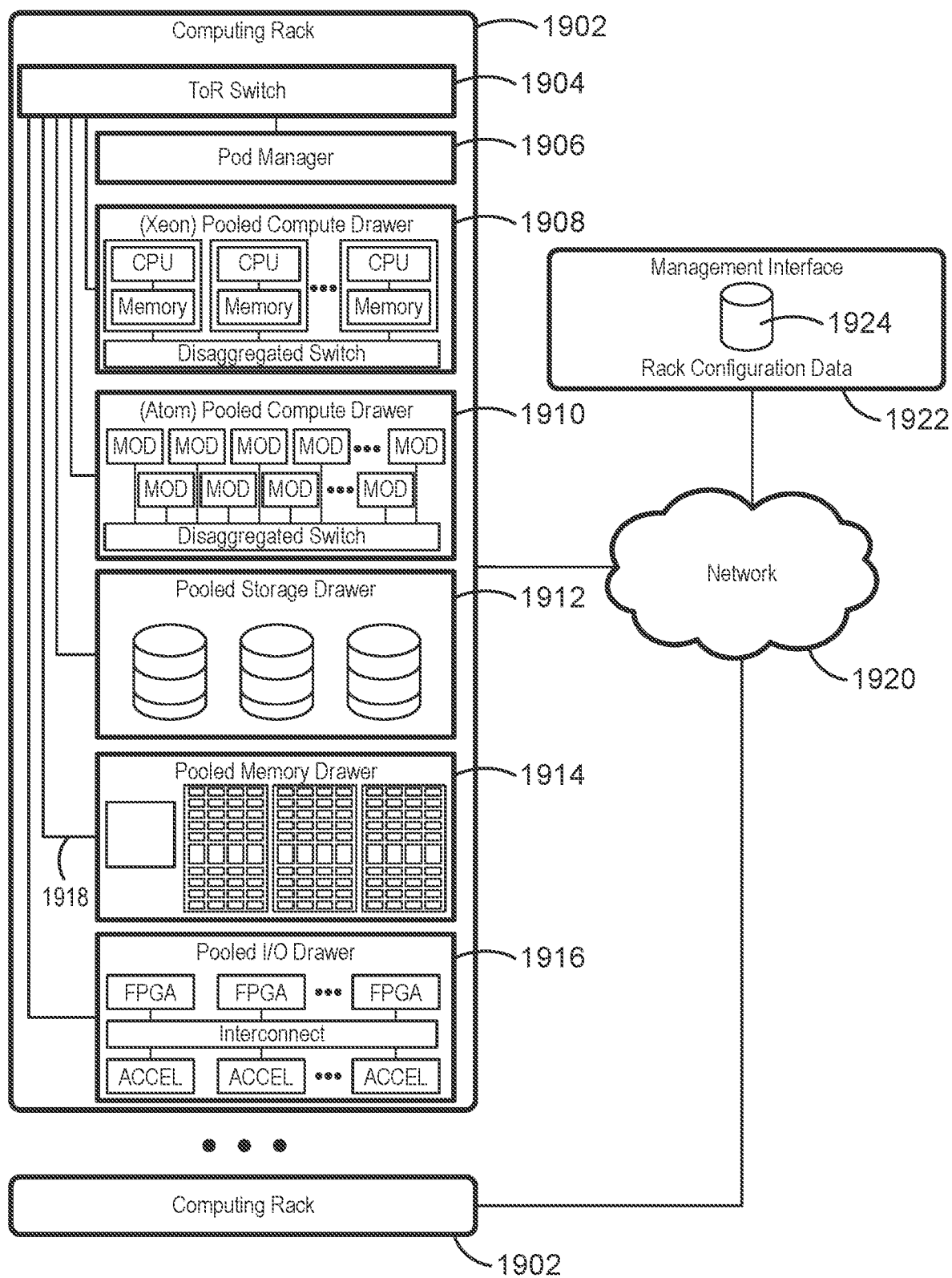
FIG. 19 depicts an environment with multiple racks.

FIG. 19 depicts an environment 1900 includes multiple computing racks 1902, each including a Top of Rack (ToR) switch 1904, a pod manager 1906, and a plurality of pooled system drawers. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an INTEL® XEON® pooled computer drawer 1908, and INTEL® ATOM™ pooled compute drawer 210, a pooled storage drawer 212, a pooled memory drawer 214, and an pooled I/O drawer 1916. Each of the pooled system drawers is connected to ToR switch 1904 via a high-speed link 1918, such as a 40 Gigabit/second (Gb/s) or 100 Gb/s Ethernet link or an 100+ Gb/s Silicon Photonics (SiPh) optical link. In one embodiment high-speed link 1918 comprises an 800 Gb/s SiPh optical link.

Multiple of the computing racks 1902 may be interconnected via their ToR switches 1904 (e.g., to a pod-level switch or data center switch), as illustrated by connections to a network 1920. In some embodiments, groups of computing racks 1902 are managed as separate pods via pod manager(s) 1906. In one embodiment, a single pod manager is used to manage all of the racks in the pod. Alternatively, distributed pod managers may be used for pod management operations.

RSD environment 1900 further includes a management interface 1922 that is used to manage various aspects of the RSD environment. This includes managing rack configuration, with corresponding parameters stored as rack configuration data 1924.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof.

Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
    a housing including a base and sidewalls, the housing to support a circuit board; and
    a heat sink to be supported by the housing independent of the circuit board, the heat sink to be thermally coupled to a semiconductor package attached to the circuit board, the heat sink to be closer to the base of the housing than the circuit board is to be to the base of the housing.

2. The apparatus of claim 1, further including a tray to be mounted to the housing with a threaded fastener, the housing to support the circuit board via the tray.

3. The apparatus of claim 2, wherein the tray is removable from the housing while the circuit board is attached to the tray and while the heat sink is coupled to the housing.

4. The apparatus of claim 2, wherein the heat sink, the circuit board, and the semiconductor package are to be between the tray and the base of the housing.

5. The apparatus of claim 4, wherein the semiconductor package is to be attached to a first side of the circuit board and a memory is to be attached to a second side of the circuit board, the first side to face the base of the housing, the second side to face away from the base of the housing.

6. The apparatus of claim 5, wherein the memory is to extend farther away from the base than the tray is spaced apart from the base when the tray is mounted to the housing.

7. The apparatus of claim 4, wherein the heat sink is to be attached to and suspended from the tray when the tray is mounted to the housing.

8. The apparatus of claim 7, further including springs to be between the tray and the circuit board, the springs to urge the circuit board and the semiconductor package towards the heat sink.

9. The apparatus of claim 2, wherein the heat sink is to be attached to at least one of the tray or a backplate via spring loaded fasteners, the spring loaded fasteners to urge the heat sink towards the backplate, the circuit board and the semiconductor package to be between the heat sink and the backplate.

10. The apparatus of claim 1, further including at least one of a frame or standoffs on the base of the housing, the heat sink to be coupled to the base via the at least one of the frame or the standoffs.

11. The apparatus of claim 1, wherein the heat sink is to be anchored to the sidewalls of the housing.

12. The apparatus of claim 1, further including a metal plate to be between the circuit board and the base of the housing, the metal plate including an opening, the heat sink to extend through the opening.

13. The apparatus of claim 12, further including a standoff block to separate the circuit board and the metal plate.

14. An apparatus, comprising:
a chassis including a first sidewall, a second sidewall opposite the first sidewall, and a bottom between the first and second sidewalls, the chassis to support a circuit board, a semiconductor package mounted on a first side of the circuit board, the first side of the circuit board to face toward the bottom of the chassis; and
a package cooling component to be thermally coupled to the semiconductor package, a weight of the package cooling component supported by the chassis independent of the circuit board.

15. The apparatus of claim 14, further including a tray selectively removable and attachable to the chassis, the circuit board to be attached to the tray.

16. The apparatus of claim 14, wherein the package cooling component is anchored to the at least one of the first sidewall, the second sidewall, or the bottom of the chassis with a spring loaded fastener, the spring loaded fastener to permit the package cooling component to move relative to the bottom of the chassis in a direction perpendicular to the bottom of the chassis.

17. The apparatus of claim 14, wherein the chassis includes a transverse support between the first and second sidewalls, the transverse support spaced apart from both ends of the first and second sidewalls.

18. The apparatus of claim 14, wherein the package cooling component includes a cold plate.

19. An apparatus, comprising:
means for cooling a semiconductor package;
means for supporting a circuit board, the semiconductor package to be mounted to the circuit board, the supporting means to be removably attached to a chassis; and
means for anchoring the cooling means to the chassis independent of the circuit board, the means for cooling to be closer to a bottom of the chassis than the circuit board is to the bottom of the chassis.

20. The apparatus of claim 19, wherein the means for anchoring includes means for urging the cooling means in a direction perpendicular to a base of the chassis.

* * * * *